(12) United States Patent
Lee

(10) Patent No.: US 11,670,511 B2
(45) Date of Patent: Jun. 6, 2023

(54) SEMICONDUCTOR DEVICE AND METHOD FOR FABRICATING THE SAME INCLUDING RE-GROWTH PROCESS TO FORM NON-UNIFORM GATE DIELECTRIC LAYER

(71) Applicant: SK hynix Inc., Gyeonggi-do (KR)

(72) Inventor: Seon-Haeng Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 23 days.

(21) Appl. No.: 17/365,063

(22) Filed: Jul. 1, 2021

(65) Prior Publication Data

US 2021/0327716 A1 Oct. 21, 2021

Related U.S. Application Data

(63) Continuation of application No. 16/533,370, filed on Aug. 6, 2019, now Pat. No. 11,081,357.

(30) Foreign Application Priority Data

Dec. 14, 2018 (KR) .......................... 10-2018-0162195

(51) Int. Cl.
*H01L 21/28* (2006.01)
*H01L 29/40* (2006.01)
(Continued)

(52) U.S. Cl.
CPC .. *H01L 21/28176* (2013.01); *H01L 21/28035* (2013.01); *H01L 21/823857* (2013.01);
(Continued)

(58) Field of Classification Search
CPC ......... H01L 29/42368; H01L 21/28176; H01L 21/28035; H01L 21/823857; H01L 29/401;
(Continued)

(56) References Cited

U.S. PATENT DOCUMENTS

| 5,633,738 A | 5/1997 | Wakui et al. |
| 2003/0047734 A1* | 3/2003 | Fu .................. H01L 29/4925 257/527 |

(Continued)

FOREIGN PATENT DOCUMENTS

| CN | 108933168 A | 12/2018 |
| JP | 2004-071653 A | 3/2004 |

(Continued)

OTHER PUBLICATIONS

Office Action for the Chinese Patent Application No. 201911199174.4 issued by the Chinese Patent Office dated Jan. 18, 2023.

*Primary Examiner* — John P. Dulka
(74) *Attorney, Agent, or Firm* — IP & T Group LLP

(57) ABSTRACT

A method for fabricating a semiconductor device includes: forming a gate structure including a source side and a drain side over a substrate, wherein a dielectric material and a columnar crystal grain material are stacked over the substrate; doping a chemical species on the drain side of the gate structure; and exposing the gate structure doped with the chemical species to a re-growth process in order to thicken the dielectric material on the drain side of the gate structure.

10 Claims, 25 Drawing Sheets

(51) Int. Cl.
*H01L 29/66* (2006.01)
*H01L 21/8238* (2006.01)
*H01L 29/78* (2006.01)
*H01L 29/49* (2006.01)
*H01L 29/423* (2006.01)

(52) U.S. Cl.
CPC ........ *H01L 29/401* (2013.01); *H01L 29/4236* (2013.01); *H01L 29/42368* (2013.01); *H01L 29/4983* (2013.01); *H01L 29/66568* (2013.01); *H01L 29/7856* (2013.01)

(58) Field of Classification Search
CPC .............. H01L 29/4236; H01L 29/4983; H01L 29/66568; H01L 29/7856; H01L 21/823842; H01L 21/28105; H01L 29/4916; H01L 29/1045; H01L 29/513; H01L 29/517; H01L 29/6659; H01L 29/66659; H01L 29/7833; H01L 29/78; H01L 29/42364; H01L 29/66477; H01L 21/02107; H01L 21/02532; H01L 21/02554; H01L 21/0337; H01L 21/32055; H01L 21/823814; H01L 21/823821; H01L 29/1025; H01L 29/41725

See application file for complete search history.

(56) References Cited

U.S. PATENT DOCUMENTS

2016/0027899 A1* 1/2016 Kim .................. H01L 29/42368
  438/276
2016/0247917 A1 8/2016 Kondo et al.

FOREIGN PATENT DOCUMENTS

| JP | 2008-187008 A | 8/2008 |
| KR | 10-2009-0111481 A | 10/2009 |
| TW | 475252 B | 2/2002 |

* cited by examiner

SEMICONDUCTOR DEVICE AND METHOD FOR FABRICATING THE SAME INCLUDING RE-GROWTH PROCESS TO FORM NON-UNIFORM GATE DIELECTRIC LAYER

CROSS-REFERENCE TO RELATED APPLICATIONS

This application is a continuation of U.S. patent application Ser. No. 16/533,370 filed on Aug. 6, 2019, which claims benefits of priority of Korean Patent Application No. 10-2018-0162195 filed on Dec. 14, 2018. The disclosure of each of the foregoing application is incorporated herein by reference in its entirety.

BACKGROUND

1. Field

Exemplary embodiments of the present invention relate to a semiconductor device, and more particularly, to a semiconductor device including a gate dielectric layer having a non-uniform thickness, and a method for fabricating the semiconductor device.

2. Description of the Related Art

Generally, for improving the performance of a transistor, the thickness of a gate dielectric layer needs to be formed thin. However, there is a limit in reducing the thickness of the gate dielectric layer due to increasing gate leakage current.

SUMMARY

Embodiments of the present invention are directed to a semiconductor device whose thickness of a gate dielectric layer on a drain side is increased, and a method for fabricating the semiconductor device.

In accordance with an embodiment of the present invention, a method for fabricating a semiconductor device includes: forming a gate structure including a source side and a drain side over a substrate, wherein a dielectric material and a columnar crystal grain material are stacked over the substrate; doping a chemical species on the drain side of the gate structure; and exposing the gate structure doped with the chemical species to a re-growth process in order to thicken the dielectric material on the drain side of the gate structure.

In accordance with another embodiment of the present invention, a semiconductor device includes: a gate structure including a dielectric material over a substrate and a columnar crystal grain material over the dielectric material, the gate structure including a source side and a drain side; and an oxidation promotion species doped on the drain side of the gate structure to increase a thickness of the dielectric material on the drain side of the gate structure. The oxidation promotion species includes fluorine (F). The dielectric material includes silicon oxide, and the oxidation promotion species increases a thickness of silicon oxide on the drain side of the gate structure. The dielectric material includes a stack of silicon oxide and a high-k material, and the oxidation promotion species increases a thickness of silicon oxide on the drain side of the gate structure. The columnar crystal grain material includes polysilicon. The gate structure includes an NMOSFET gate structure and a PMOSFET gate structure, and the oxidation promotion species is included in the drain side of the NMOSFET gate structure and the source side and the drain side of the PMOSFET gate structure. The substrate includes a channel region that is disposed between the drain side and the source side of the gate structure and overlaps with the gate structure, and the channel region includes at least one selected from a group including a planar channel, a recess channel, a fin channel, and combinations thereof. The channel region includes a doped channel that is doped with a P-type impurity that contacts the source side of the gate structure, and the doped channel does not overlap with the drain side of the gate structure. The substrate further includes a drain region overlapping with the drain side of the gate structure; and a source region overlapping with the source side of the gate structure. The dielectric material of the gate structure includes a drain side formed on the drain side of the gate structure; and a source side formed on the source side of the gate structure, the drain side contains the oxidation promotion species, and the drain side is thicker than the source side. The dielectric material of the gate structure has a thickness that gradually and continuously increases from the source side of the gate structure toward the drain region of the gate structure. The gate structure includes a columnar crystal grain portion including the columnar crystal grain material and formed on the drain side of the gate structure; and a non-columnar crystal grain portion formed on the source side of the gate structure, the columnar crystal grain portion contains the oxidation promotion species, and the non-columnar crystal grain portion contains the oxidation promotion species.

These and other features and advantages of the present invention will become apparent to those skilled in the art of the invention from the following detailed description in conjunction with the following drawings.

DETAILED DESCRIPTION

Figure 1A:
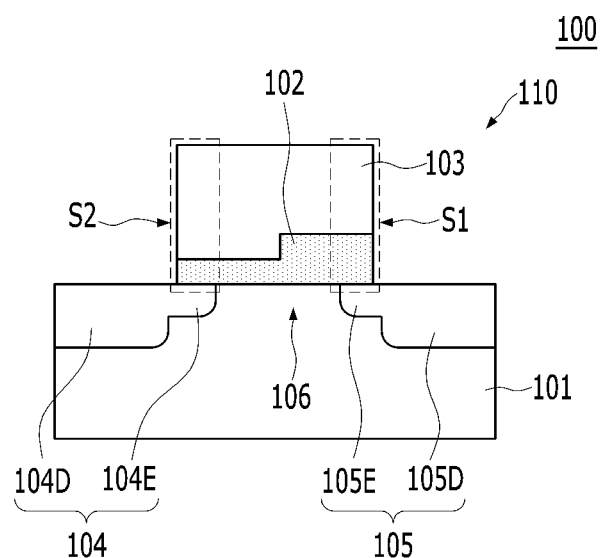
FIG. 1A is a cross-sectional view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

It should also be understood that a feature described with an embodiment may be employed with one or more features of other embodiments without departing from the scope of the present invention.

In describing the invention, features which are well-known in the art are omitted for avoiding obscuring the described invention.

Figure 1B:
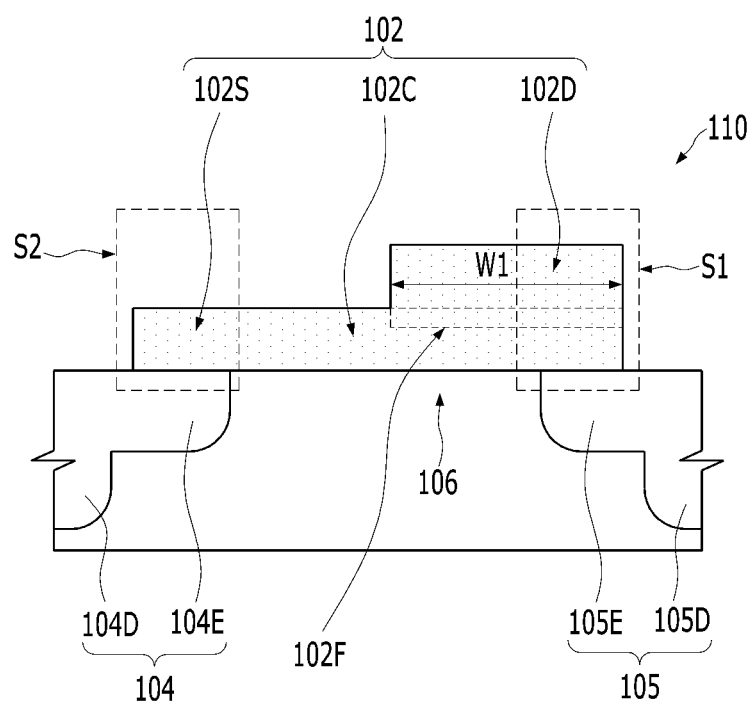
FIG. 1B is a cross-sectional view illustrating a gate structure 110 of FIG. 1A.

Referring now to FIG. 1A, a cross-sectional view illustrating a semiconductor device 100 in accordance with an embodiment of the present invention is provided. FIG. 1B is a cross-sectional view illustrating a gate structure 110 of FIG. 1A.

Referring to FIGS. 1A and 1B, the semiconductor device 100 may include a transistor. The semiconductor device 100 may include a gate structure 110 which is formed over a substrate 101. The gate structure 110 may include an oxidation promotion species 102F. The gate structure 110 may include a gate electrode 103 and a gate dielectric layer 102 disposed between the substrate 101 and the gate electrode 103. The oxidation promotion species 102F may be included in at least a portion of the gate dielectric layer 102. The oxidation promotion species 102F may be included in the gate electrode 103. The gate structure 110 may include a stack of the gate dielectric layer 102 and the gate electrode 103. The semiconductor device 100 may further include a source region 104 and a drain region 105 that are formed in the substrate 101. The semiconductor device 100 may further include a channel region 106 disposed between the source region 104 and the drain region 105.

The gate structure 110 may include a drain side S1 and a source side S2. The drain side S1 and the source side S2 of the gate structure 110 may refer to sidewall portions of the gate structure 110. The drain side S1 of the gate structure 110 may refer to a sidewall portion overlapping with the drain region 105, and the source side S2 of the gate structure 110 may refer to a portion overlapping with the source region 104. The gate structure 110 may be a patterned gate structure.

The channel region 106 may be formed in the substrate 101 between the drain side S1 and the source side S2 of the gate structure 110. The channel region 106 may overlap with the gate structure 110. The channel region 106 may be a planar channel.

The substrate 101 may be a material suitable for semiconductor processing. The substrate 101 may include a semiconductor substrate. The substrate 11 may be formed of a material containing silicon. The substrate 101 may include silicon, monocrystalline silicon, polysilicon, amorphous silicon, silicon germanium, monocrystalline silicon germanium, polycrystalline silicon germanium, carbon-doped silicon, combinations thereof, or multilayers thereof. The substrate 101 may include other semiconductor materials, such as germanium. The substrate 101 may include an III/V-group semiconductor substrate, for example, a compound semiconductor substrate, such as GaAs. The substrate 101 may include an SOI (Silicon-On-Insulator) substrate.

The gate dielectric layer 102 may include a dielectric material. The gate dielectric layer 102 may, for example, include silicon oxide, silicon nitride, silicon oxynitride, or a combination thereof. The gate dielectric layer 102 may include a high-k material. The gate dielectric layer 102 may include hafnium oxide, zirconium oxide, or a combination thereof. According to another embodiment of the present invention, the gate dielectric layer 102 may include a stack of silicon oxide and a high-k material that are stacked sequentially. In this case, the silicon oxide may contain the oxidation promotion species 102F.

The gate electrode 103 may include a silicon-containing material, a metal-containing material, or a combination thereof. The gate electrode 103 may include polysilicon, doped polysilicon, metal, a metal nitride, a metal silicide, or a combination thereof. According to the embodiment of the present invention, the gate electrode 103 may include doped polysilicon, and the doped polysilicon may include an N-type impurity or a P-type impurity. The gate electrode 103 may include a columnar crystal grain material. The gate electrode 103 may be a columnar crystal grain polysilicon. The gate electrode 103 may be boron-doped columnar crystal grain polysilicon, arsenic-doped columnar crystal grain polysilicon, or a phosphorus-doped columnar crystal grain polysilicon. The gate electrode 103 may be a stack including a metal material over a doped columnar crystal grain polysilicon.

The drain region 105 may include a deep drain region 105D and a shallow drain region 105E. The deep drain region 105D may contain a high-concentration impurity, and the shallow drain region 105E may contain a low-concentration impurity. In this case, the shallow drain region 105E may be referred to as a lightly doped drain (LDD). According to another embodiment of the present invention, the deep drain region 105D and the shallow drain region 105E may contain impurities of the same concentration. In this case, the shallow drain region 105E may be referred to as a drain extension region. The drain region 105 may be laterally extended to overlap at least partially with the drain side S1 of the gate structure 110 by the shallow drain region 105E. In the illustrated embodiment the drain region 105 laterally extends so that the shallow drain region 105E overlaps fully or substantially fully with the drain side S1 of the gate structure 110.

The source region 104 may include a deep source region 104D and a shallow source region 104E. The deep source region 104D may contain a high-concentration impurity, and the shallow source region 104E may contain a low-concentration impurity. In this case, the shallow source region 105E may be referred to as a lightly doped source (LDS). According to another embodiment of the present invention, the deep source region 104D and the shallow source region 104E may contain impurities of the same concentration. In this case, the shallow source region 104E may be referred to as a source extension region. The source region 104 may be laterally extended to overlap at least partially with the source side S2 of the gate structure 110 by the shallow source region 104E. In the illustrated embodiment the source region 104 laterally extends so that the shallow source region 104E overlaps fully or substantially fully with the source side S2 of the gate structure 110. In the illustrated embodiment, the deep drain region 105D may not overlap with the drain side S1 of the gate structure 110 and the deep source region 104D may not overlap with the source side S2 of the gate structure 110.

The source region 104 and the drain region 105 may include an N-type impurity. The source region 104 may be referred to as an n-type source region, and the drain region 105 may be referred to as an n-type drain region. The gate structure 110, the source region 104, the drain region 105, and the channel region 106 may form an N-channel transistor (NFET). The N-channel transistor may be an N-channel metal-oxide-semiconductor field-effect transistor (NMOSFET).

According to another embodiment of the present invention, the source region 104 and the drain region 105 may include a P-type impurity. The source region 104 may be referred to as a P-type source region, and the drain region 105 may be referred to as a P-type drain region. The gate structure 110, the source region 104, the drain region 105, and the channel region 106 may be part of a P-channel transistor. The P-channel transistor may be a PFET or a PMOSFET.

The shallow drain region 105E and the shallow source region 104E may disperse the electric field of the drain region 105 and the source region 104. This may reduce the lateral electric field, and, therefore, may also decrease a hot carrier effect.

The gate dielectric layer 102 may have a non-uniform thickness. Specifically, as illustrated in the embodiment of FIG. 1A, the gate dielectric layer 102 may have a one-step shape with a vertical riser between the top tread and the lower tread. The gate dielectric layer 102 may have a thickness that is thicker on the drain side S1 of the gate structure 110 than on the source side S2. The gate dielectric layer 102 may include a drain-side gate dielectric layer 102D and a source-side gate dielectric layer 102S. The drain-side gate dielectric layer 102D may be formed on the drain side S1 of the gate structure 110, and the source-side gate dielectric layer 102S may be formed on the source side S2 of the gate structure 110. The drain-side gate dielectric layer 102D and the source-side gate dielectric layer 102S may have different thicknesses. The drain-side gate dielectric layer 102D may be thicker than the source-side gate dielectric layer 102S. The gate dielectric layer 102 having a drain-side gate dielectric layer (e.g., 102D) and a source-side gate dielectric layer (e.g., 102S) having different thicknesses is also referred to herein as an asymmetric gate dielectric layer.

The gate dielectric layer 102 may include the oxidation promotion species 102F locally. For example, in an embodiment, the drain-side gate dielectric layer 102D may include the oxidation promotion species 102F while the source-side gate dielectric layer 102S may not include any oxidation promotion species 102F.

The drain-side gate dielectric layer 102D may overlap with the drain region 105 and, in particular, with the shallow drain region 105E. The source-side gate dielectric layer 102S may overlap with the source region 104 and, in particular, with the shallow source region 104E.

The drain side S1 of the gate structure 110 may include an edge of the drain-side gate dielectric layer 102D. The edge of the drain-side gate dielectric layer 102D may overlap with a portion of the drain region 105 and, in particular, with the shallow drain region 105E. The source side S2 of the gate structure 110 may include an edge of the source-side gate dielectric layer 102S. The edge of the source-side gate dielectric layer 102S may overlap with a portion of the source region 104 and, in particular, with the shallow source region 104E.

The gate dielectric layer 102 may further include a channel-side gate dielectric layer 102C between the drain-side gate dielectric layer 102D and the source-side gate dielectric layer 102S. The channel-side gate dielectric layer 102C may be disposed between the drain side S1 and the source side S2 of the gate structure 110. The channel-side gate dielectric layer 102C may overlap with a channel region 106. The channel-side gate dielectric layer 102C may include both of a portion whose thickness is the same as the thickness of the drain-side gate dielectric layer 102D and a portion whose thickness is the same as the thickness of the source-side gate dielectric layer 102S. The thickness of the drain-side gate dielectric layer 102D may be uniform from the channel-side gate dielectric layer 102C to the drain side S1. The thickness of the source-side gate dielectric layer 102S may be uniform from the source side S2 to the channel-side gate dielectric layer 102C.

The oxidation promotion species 102F may be disposed on the drain-side gate dielectric layer 102D. The concentration of the oxidation promotion species 102F may be uniform on the drain-side gate dielectric layer 102D.

The drain-side gate dielectric layer 102D and the source-side gate dielectric layer 102S may have the same width. According to another embodiment of the present invention, the drain-side gate dielectric layer 102D may have a wider width than the source-side gate dielectric layer 102S. According to another embodiment of the present invention, the drain-side gate dielectric layer 102D may have a narrower width than the source-side gate dielectric layer 102S. The drain-side gate dielectric layer 102D may have a width that fully or substantially fully overlaps at least with the shallow drain region 105E.

As described above, the gate dielectric layer 102 may be formed in an asymmetric structure having a drain-side dielectric layer (e.g., 102D) with a thickness that is different from the thickness of the source-side dielectric layer (e.g., 102S) due to the oxidation promotion species 102F. The gate dielectric layer 102 of the asymmetric structure may be thicker on the drain side S1 of the gate structure 110 than the source side S2 of the gate structure. Since the vertical electric field between the drain region 105 and the gate electrode 103 is reduced, the hot carrier effect may be substantially reduced or fully prevented.

Figure 1C:
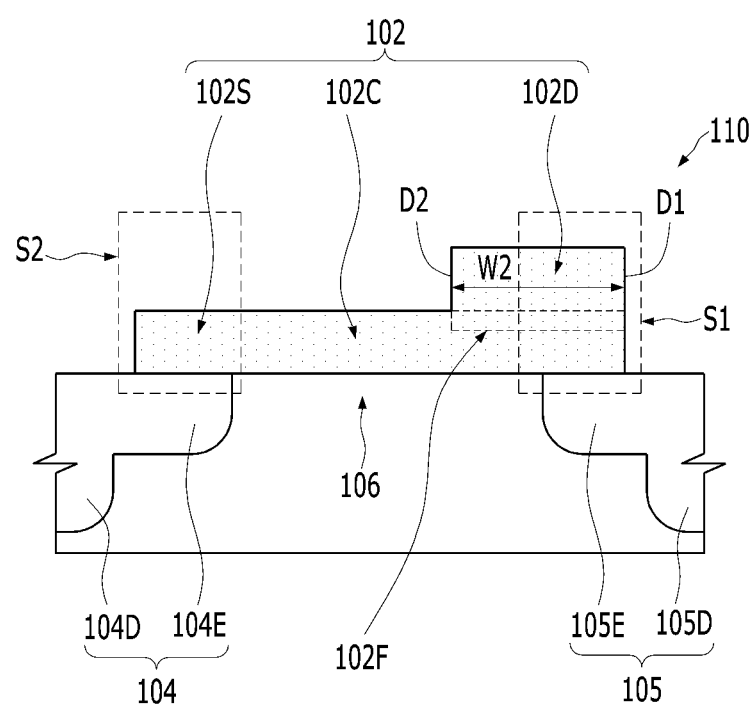
FIGS. 1C and 1D are cross-sectional views illustrating a gate structure of FIG. 1A in accordance with a modified example of the embodiment of the present invention.
Figure 1D:
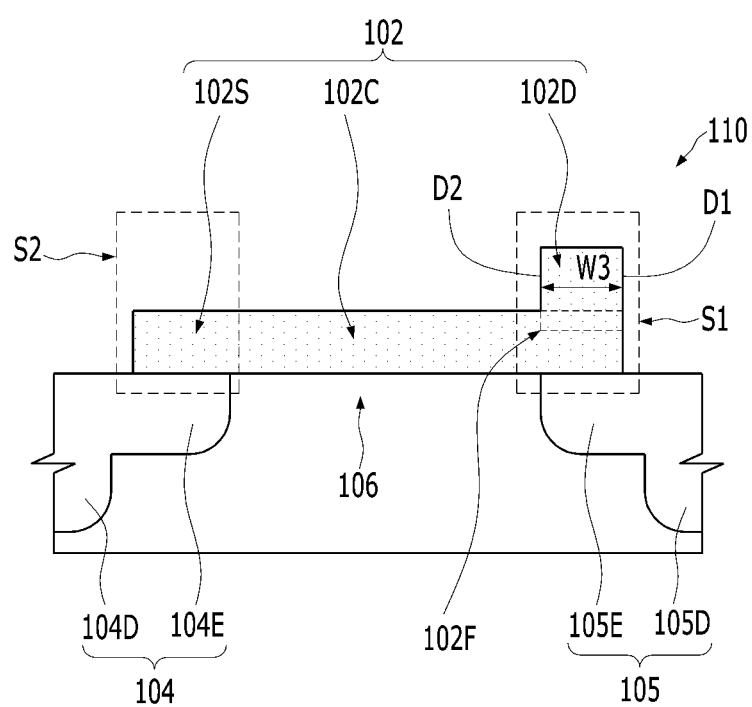

FIGS. 1C and 1D are cross-sectional views illustrating the gate structure of FIG. 1A in accordance with a modified example of the embodiment of the present invention.

Referring to FIG. 1C, the gate dielectric layer 102 may include a drain-side gate dielectric layer 102D and a source-side gate dielectric layer 102S. The drain-side gate dielectric layer 102D may include an oxidation promotion species 102F. The drain-side gate dielectric layer 102D may be thicker than the source-side gate dielectric layer 102S. Thus, the gate dielectric layer 102 may be thick on the drain side S1 of the gate structure 110. The drain-side gate dielectric layer 102D may have a second width W2 overlapping with the drain region 105. The second width W2 may be smaller than the first width W1 of FIG. 1B. One edge D1 of the drain-side gate dielectric layer 102D may overlap with the drain region 105, and, in particular, edge D1 may overlap with the shallow drain region 105E. Another edge D2 of the drain-side gate dielectric layer 102D may overlap with the channel region 106.

Referring to FIG. 1D, the gate dielectric layer 102 may include a drain-side gate dielectric layer 102D and a source-side gate dielectric layer 102S. The drain-side gate dielectric layer 102D may include an oxidation promotion species 102F. The drain-side gate dielectric layer 102D may be thicker than the source-side gate dielectric layer 102S. Thus, the gate dielectric layer 102 may be thick on the drain side S1 of the gate structure 110. The drain-side gate dielectric layer 102D may have a third width W3 which is smaller than the first width W1 of FIG. 1B and/or the second width W2 of FIG. 1C. One edge D1 of the drain-side gate dielectric layer 102D may overlap with the drain region 105, and, in particular, edge D1 may overlap with the shallow drain region 105E. Another edge D2 of the drain-side gate dielectric layer 102D may be aligned with an edge of the shallow drain region 105E and may not overlap with the channel region 106.

FIGS. 2A to 2E are cross-sectional views illustrating an example of a method for fabricating a semiconductor device.

FIGS. 2A to 2E illustrate an example of a method for fabricating the semiconductor device 100 shown in FIG. 1A.

Figure 2A:
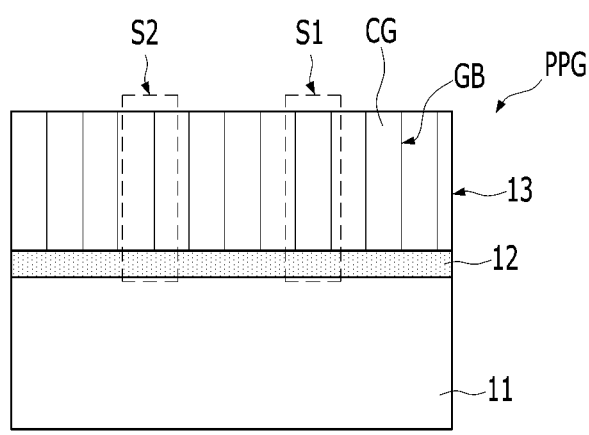
FIGS. 2A to 2E are cross-sectional views illustrating an example of a method for fabricating a semiconductor device.

Referring to FIG. 2A, a substrate 11 may be prepared. The substrate 11 may include a silicon substrate.

An initial gate dielectric layer 12 may be formed over the substrate 11. The initial gate dielectric layer 12 may, for example, include silicon oxide. The initial gate dielectric layer 12 may not be limited to silicon oxide. For example, the initial gate dielectric layer 12 may include silicon nitride, silicon oxynitride, a high-k material, or a combination thereof. The initial gate dielectric layer 12 may be formed by a thermal oxidation process. The initial gate dielectric layer 12 may have a uniform thickness. The initial gate dielectric layer 12 may be referred to as 'a symmetrical gate dielectric layer'. To improve the performance of a transistor, the initial gate dielectric layer 12 may be thin. The initial gate dielectric layer 12 may have a thin thickness enough to effectively suppress leakage current.

A gate conductive layer 13 may be formed over the initial gate dielectric layer 12. The gate conductive layer 13 may be formed to include a columnar crystal grain material which includes a plurality of columnar crystal grains CG. The columnar crystal grains CG may include a plurality of grain boundaries GB. The grain boundaries GB may serve as a diffusion path of a dopant and an oxidation promotion species. The columnar crystal grains CG and the grain boundaries GB may extend vertically from the top surface of the initial gate dielectric layer 12. The gate conductive layer 13 may be referred to as a columnar crystal grain layer.

The gate conductive layer 13 may include a silicon-containing material. The gate conductive layer 13 may include columnar crystal grain polysilicon. The gate conductive layer 13 may include doped columnar crystal grain polysilicon. The gate conductive layer 13 may include an N-type impurity or a P-type impurity. The gate conductive layer 13 may include a boron-doped columnar crystal grain polysilicon or an arsenic-doped columnar crystal grain polysilicon. As an example of forming doped columnar crystal grain polysilicon, an implantation process of implanting an impurity may be performed after undoped columnar crystal grain polysilicon is deposited on the initial gate dielectric layer 12. Formation of columnar crystals is well known in the art and, therefore, there is no need to describe in more detail the step of forming the gate conductive layer 13.

According to an embodiment of the present invention, a top surface of the gate conductive layer 13 may be planarized.

As described above, the stack of the initial gate dielectric layer 12 and the gate conductive layer 13 may be referred to as a layered structure. After forming the layered structure, a subsequent doping process 15I may be performed. Also, the stack of the initial gate dielectric layer 12 and the gate conductive layer 13 may be a pre-patterned gate structure PPG. The pre-patterned gate structure PPG may refer to the structure before a gate patterning process. The pre-patterned gate structure PPG may include a drain side S1 and a source side S2.

Figure 2B:
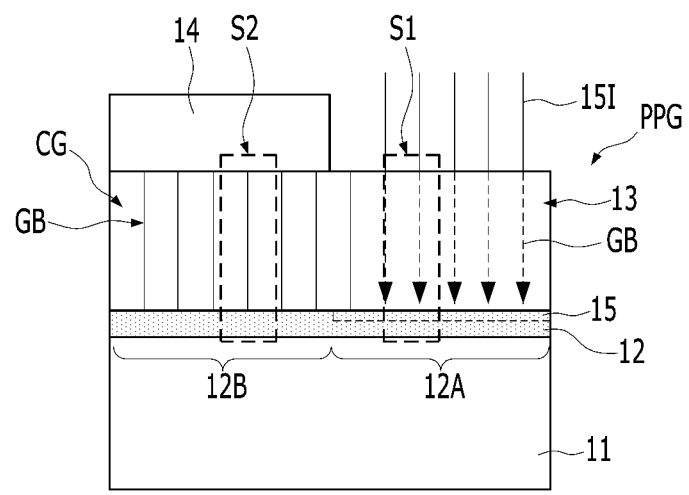

As shown in FIG. 2B, a mask layer 14 may be formed over the gate conductive layer 13. The mask layer 14 may include a photoresist pattern. The mask layer 14 may block a portion of the gate conductive layer 13. The mask layer 14 may expose the other portion of the gate conductive layer 13.

A doping process 15I may be performed on the pre-patterned gate structure PPG. The doping process 15I may sequentially perform an implantation process of a species and a post-annealing process. The doping process 15I may be performed on an exposed portion of the gate conductive layer 13. The exposed portion of the gate conductive layer 13 may be doped with a chemical species, for example, an oxidation promotion species 15 by the doping process 15I. The oxidation promotion species 15 may include a material capable of selectively quickly re-oxidizing the initial gate dielectric layer 12 during a subsequent re-growth process. In an embodiment, the oxidation promotion species 15 may include fluorine (F).

The doping process 15I may be performed by using the mask layer 14 as a barrier. A selected portion of the initial gate dielectric layer 12 may be doped with an oxidation promotion species 15. The selected portion 12A of the initial gate dielectric layer 12 may be a portion doped with the oxidation promotion species 15, and the unselected portion 12B of the initial gate dielectric layer 12 may be a portion that is not doped with the oxidation promotion species 15. The selected portion 12A of the initial gate dielectric layer 12 may be referred to as a drain side, and the unselected portion 12B of the initial gate dielectric layer 12 may be referred to as a source side. Thus, the pre-patterned gate structure PPG may include the initial gate dielectric layer 12 and a gate conductive layer 13 that are stacked, and may include the drain side and the source side.

The oxidation promotion species 15 may be doped on the gate conductive layer 13 and the initial gate dielectric layer 12 by an implantation process. The implantation process may include a vertical implantation process. For example, a dopant may be implanted perpendicularly to the surface of the substrate 11. The oxidation promotion species 15 may be piled up on the interface between the selected portion 12A of the initial gate dielectric layer 12 and the gate conductive layer 13 by the post-annealing process after the implantation process. The oxidation promotion species 15 may be piled up on the selected portion 12A of the initial gate dielectric layer 12. The oxidation promotion species 15 doped on the gate conductive layer 13 may be diffused into the selected portion 12A of the initial gate dielectric layer 12 along the grain boundaries GB of the gate conductive layer 13.

As described above, the oxidation promotion species 15 may be piled up on the drain side S1 of the pre-patterned gate structure PPG by the doping process 15I of the oxidation promotion species 15. For example, the oxidation promotion species 15 may be piled up on the selected portion 12A of the initial gate dielectric layer 12. Having formed the gate conductive layer 13 to include columnar crystal grains CG and grain boundaries GB, facilitates the rapid diffusion of the oxidation promotion species 15.

The selected portion 12A of the initial gate dielectric layer 12 may be referred to as a doped initial gate dielectric layer 12A as it is doped with the oxidation promotion species 15. The unselected portion 12B of the initial gate dielectric layer 12 may be referred to as the undoped initial gate dielectric layer 12B as it is not doped with the oxidation promotion species 15. For example, when the oxidation promotion species 15 includes fluorine, the doped initial gate dielectric layer 12A may be a fluorine-doped initial gate dielectric layer. When the initial gate dielectric layer 12 includes silicon oxide, the doped initial gate dielectric layer 12A may be a fluorine-doped silicon oxide. The fluorine-doped silicon oxide may also be referred to as fluorinated silicon oxide. The undoped initial gate dielectric layer 12B may include undoped silicon oxide.

The oxidation promotion species 15 may be piled up on the surface of the doped initial gate dielectric layer 12A.

As described above, after the gate conductive layer 13 is formed, the doping process 15I of the oxidation promotion species 15 may be performed. As a comparative example, when the doping process 15I of the oxidation promotion species 15 is performed directly on the initial gate dielectric layer 12 prior to the formation of the gate conductive layer 13, the initial gate dielectric layer 12 may be damaged according to a phenomenon known as degrading Time Dependent Dielectric Breakdown (TDDB).

In addition, forming the gate conductive layer 13 to have a columnar crystal grain structure with vertical grain boundaries GB extending through the gate conductive layer 13 which provide a diffusion path for the oxidation promotion species 15, facilitates the diffusion of the oxidation promotion species 15 through the gate conductive layer 13 to the initial gate dielectric layer 12 with a lower ion implantation energy than if the gate conductive layer did not have the columnar grain structure. In addition, since the gate conductive layer 13 has a columnar crystal grain structure, the thickness of the gate conductive layer 13 may be reduced. Since the oxidation promotion species 15 is also doped on the gate conductive layer 13, it is possible to prevent the external diffusion of a conductive impurity (e.g. boron).

Figure 2C:
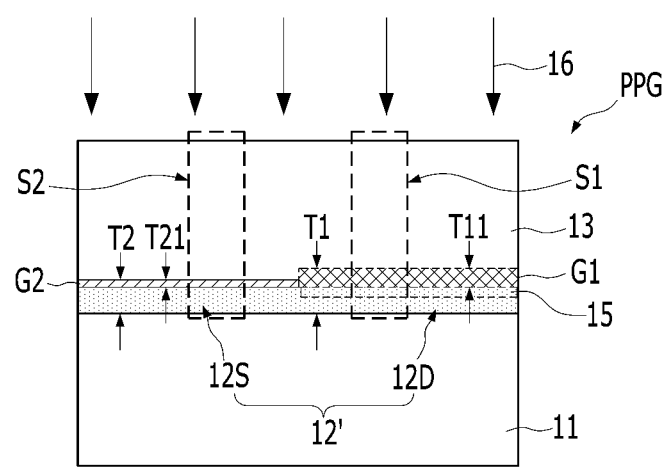

Referring to FIG. 2C, the mask layer 14 may be removed.

A re-growth process 16 may be performed. The re-growth process 16 may be performed in an atmosphere of oxygen. The re-growth process 16 may be referred to as an oxidation process or a re-oxidation process. The doped initial gate dielectric layer 12A and the undoped initial gate dielectric layer 12B may grow again through the re-growth process 16. While the re-growth process 16 is performed, the doped initial gate dielectric layer 12A may be re-oxidized to grow thicker than the undoped initial gate dielectric layer 12B due to the oxidation promotion species 15. Hence, first and second growth layers G1 and G2 may be formed by the re-growth process 16. The first growth layer G1 may be a material that has re-grown from the doped initial gate dielectric layer 12A. The second growth layer G2 may be a material that has re-grown from the undoped initial gate dielectric layer 12B. The re-growth process 16 may be performed with the mask layer 14 remains. In an embodiment, the doped initial gate dielectric layer 12A may include fluorine-doped silicon oxide, and the silicon oxide may re-grow faster than the undoped silicon oxide due to the presence of the fluorine during the re-growth process 16.

Through the re-growth process 16 as described above, a pre-patterned gate dielectric layer 12' having gate dielectric layers 12D and 12S of different thicknesses. For example, a thin gate dielectric layer 12S and a thick gate dielectric layer 12D may be formed. The thick gate dielectric layer 12D may include a first growth layer G1, and the thin gate dielectric layer 12S may include a second growth layer G2. The thick gate dielectric layer 12D may be thicker than the doped initial gate dielectric layer (12A of FIG. 2B). The thin gate dielectric layer 12S may be thicker than the undoped initial gate dielectric layer (12B of FIG. 2B). The thick gate dielectric layer 12D may include the oxidation promotion species 15, and the thin gate dielectric layer 12S may not contain the oxidation promotion species 15.

The doped initial gate dielectric layer (12A of FIG. 2B) has a faster re-growth rate than the undoped initial gate dielectric layer (FIG. 12B) that does not contain the oxidation promotion species 15. Thus, the thick gate dielectric layer 12D may be formed due to the rapid re-growth of the doped initial gate dielectric layer 12A, and the thin gate dielectric layer 12S may be formed through the re-growth of the undoped initial gate dielectric layer 12B. A thickness T1 of the thick gate dielectric layer 12D may be greater than a thickness T2 of the thin gate dielectric layer 12S. A thickness T11 of the first growth layer G1 may be greater than a thickness T21 of the second growth layer G2.

The thin gate dielectric layer 12S may be thin silicon oxide, and the thick gate dielectric layer 12D may be thick silicon oxide which contains an oxidation promotion species.

After the doping process 15I and the re-growth process 16 are performed, a patterned gate structure PG may be formed by etching the pre-patterned gate structure, which is of a layered structure.

Figure 2D:
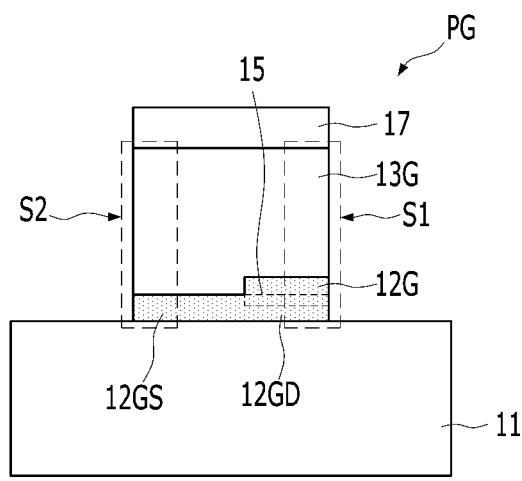

Referring to FIG. 2D, the patterned gate structure PG may be formed. The gate conductive layer 13 and the pre-patterned gate dielectric layer 12' may be etched by using a gate mask 17 in order to form the patterned gate structure PG.

First, a gate electrode 13G may be formed. The gate electrode 13G may be formed by etching the gate conductive layer 13. For example, the gate conductive layer 13 may be etched by using the gate mask 17 as an etch barrier.

Subsequently, the pre-patterned gate dielectric layer 12' may be etched. As a result, a gate dielectric layer 12G having an asymmetrical structure with different thicknesses in the doped and undoped portions may be formed below the gate electrode 13G. The gate dielectric layer 12G may include a drain-side gate dielectric layer 12GD and a source-side gate dielectric layer 12GS which is thinner than the drain-side gate dielectric layer 12GD. The drain-side gate dielectric layer 12GD may include the oxidation promotion species 15, and the source-side gate dielectric layer 12GS may not include the oxidation promotion species 15. The drain-side gate dielectric layer 12GD may be formed by etching the thick gate dielectric layer 12D. The source-side gate dielectric layer 12GS may be formed by etching the thin gate dielectric layer 12S.

The patterned gate structure PG may include a stack of the gate dielectric layer 12G and the gate electrode 13G. The patterned gate structure PG may include the drain side S1 and the source side S2.

Figure 2E:
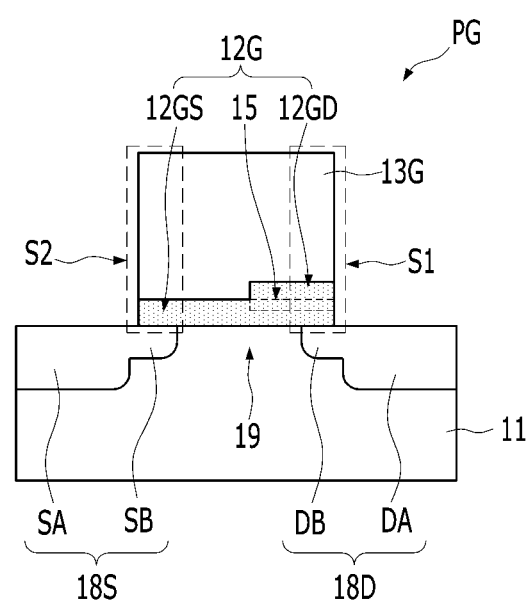

Referring to FIG. 2E, after removing the gate mask 17, a source region 18S and a drain region 18D may be formed. The source region 18S and the drain region 18D may be formed by a doping process of a conductive impurity. The conductive impurity may include boron, arsenic, phosphorous, or a combination thereof. The conductive impurity may include an N-type impurity. The source region 18S may include a deep source region SA and a shallow source region SB. The drain region 18D may include a deep drain region DA and a shallow drain region DB. The shallow source region SB, the deep source region SA, the shallow drain region DB, and the deep drain region DA may include the same dopant. The source region 18S and the drain region 18D may be part of an NFET. The source region 18S and the drain region 18D may include an N-type impurity. The shallow source region SB may have a lower dopant concentration than the deep source region SA, and the shallow drain region DB may have a lower dopant concentration than the deep drain region DA.

A channel region 19 may be defined between the shallow source region SB and the shallow drain region DB. For example, the channel region 19 may include a silicon channel or a silicon germanium channel.

The channel region 19 may contain a channel impurity, and the channel impurity may be doped on the substrate 11 by a channel doping process prior to the formation of the initial gate dielectric layer 12. The width of the channel region 19 may be defined by the shallow source region SB and the shallow drain region DB.

The patterned gate structure PG may be a stack of the gate dielectric layer 12G and the gate electrode 13G. The patterned gate structure PG may include the drain side S1 and the source side S2. The gate dielectric layer 12G may be formed to have an asymmetric structure of different thicknesses because of the oxidation promotion species 15 as explained above The thickness of the gate dielectric layer 12G having the asymmetric structure may be thicker on the drain side S1 of the patterned gate structure PG than on the source side S2 of the patterned gate structure PG.

It has been observed that forming the gate dielectric layer 12G to be asymmetrical, i.e., to have different thicknesses on the drain side S1 and the source side S2 may reduce the vertical electric field. Also, forming the shallow source and drain regions 18SE and 18DE may reduce the lateral electric field. As a result, an improved semiconductor device is possible exhibiting an improved balance of performance characteristics and leakage current when compared to existing devices employing a symmetrical gate dielectric layer.

In addition, as described above an advantageous method of forming the aforementioned asymmetrical gate dielectric layer and the shallow drain and source regions is provided which is rapid and efficient.

FIGS. 3A to 3D are cross-sectional views illustrating another example of a method for fabricating a semiconductor device. FIGS. 3A to 3D illustrate another example of a method for fabricating the semiconductor device 100 shown in FIG. 1A. The fabrication method shown in FIGS. 3A to 3D may be partially similar to the fabrication method shown in FIGS. 2A to 2E.

Figure 3A:
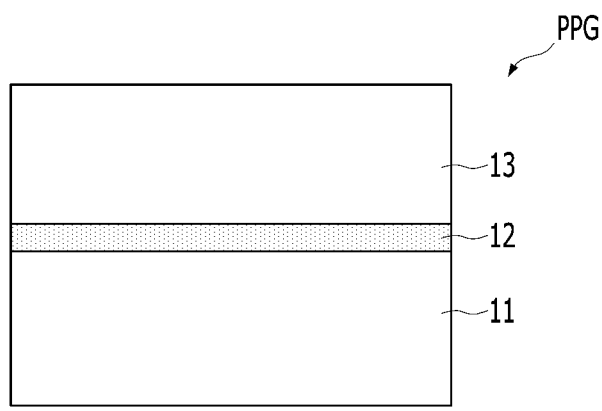
FIGS. 3A to 3D are cross-sectional views illustrating another example of a method for fabricating a semiconductor device.

Referring to FIGS. 2A and 3A, an initial gate dielectric layer 12 may be formed over a substrate 11. The initial gate dielectric layer 12 may, for example, include silicon oxide. The initial gate dielectric layer 12 may not be limited to silicon oxide. For example, the initial gate dielectric layer 12 may include silicon nitride, silicon oxynitride, a high-k material, or a combination thereof. In an embodiment, the initial gate dielectric layer 12 may be formed by thermal oxidation.

A gate conductive layer 13 may be formed over the initial gate dielectric layer 12. The gate conductive layer 13 may be formed to include a plurality of columnar crystal grains CG (not shown) and grain boundaries GB (not shown) (see FIG. 2A).

As shown above, after a pre-patterned gate structure PPG of a layered structure including the initial gate dielectric layer 12 and the gate conductive layer 13 is formed, a patterned gate structure PG may be formed by etching the pre-patterned gate structure PPG.

Figure 3B:
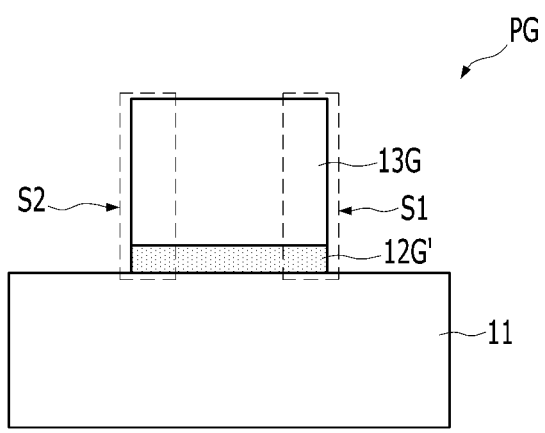

Referring to FIG. 3B, a gate patterning process may be performed to form a patterned gate structure PG. A gate electrode 13G and a gate dielectric layer 12G' may be formed by the gate patterning process. In order to form the gate electrode 13G, the gate conductive layer 13 may be etched with an unillustrated gate mask (17 in FIG. 2D) as an etch barrier. Subsequently, to form the gate dielectric layer 12G', the initial gate dielectric layer 12 below the gate electrode 13G may be etched.

As described above, the gate patterning process may be performed ahead of a doping process of an oxidation promotion species in accordance with the embodiment of the present invention.

The patterned gate structure PG may include a drain side S1 and a source side S2.

Figure 3C:
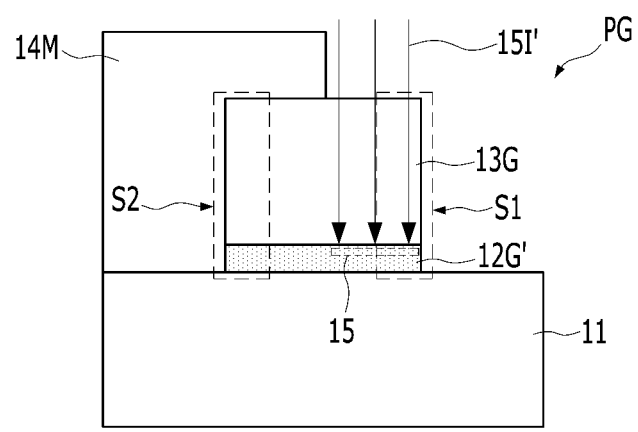

Referring to FIG. 3C, a mask layer 14M may be formed over the gate electrode 13G to cover only a portion of the gate electrode 13G that includes the source side S2 of the patterned gate structure PG. The mask layer 14M may expose another portion of the gate electrode 13G which includes the drain side S1 of the patterned gate structure PG. The mask layer 14M may include a photoresist pattern.

A doping process 15I' may be performed on the drain side S1 of the patterned gate structure PG. The doping process 15I' may include an implantation process and a post-annealing process that are sequentially performed with the post-annealing process following the implantation process. The doping process 15I' may be performed with the mask layer 14M used as a barrier. A selected portion of the gate dielectric layer 12G' may be doped with an oxidation promotion species 15 by the doping process 15I'. The oxidation promotion species 15 may be piled up on the surface of the gate dielectric layer 12G'. The doping process 15I' may be performed in the same manner as the doping process 15I of FIG. 2B. In an embodiment, the oxidation promotion species 15 may contain fluorine.

Figure 3D:
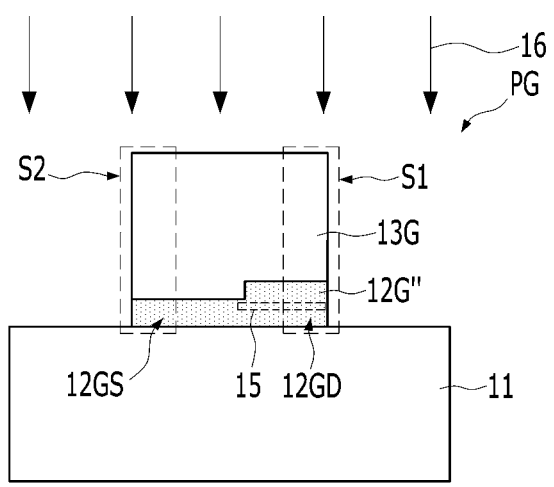

Referring to FIG. 3D, the mask layer 14M may be removed.

A re-growth process 16 may be performed. The re-growth process 16 may be performed in an atmosphere of oxygen. The gate dielectric layer 12G' may re-grow through the re-growth process 16. During the re-growth process 16, the portion doped with the oxidation promotion species 15 may be re-oxidized to be thicker than the undoped portion. Thus, a gate dielectric layer 12G" having an asymmetrical structure with different thicknesses in the doped and undoped portions may be formed by the re-growth process 16. The gate dielectric layer 12G" may include a drain-side gate dielectric layer 12GD and a source-side gate dielectric layer 12GS which is thinner the drain-side gate dielectric layer 12GD. The drain-side gate dielectric layer 12GD may include the oxidation promotion species 15, and the source-side gate dielectric layer 12GS may not include the oxidation promotion species 15.

The gate dielectric layer 12G" may have a non-uniform thickness just as the gate dielectric layer 12G of FIG. 2E does.

According to another embodiment of the present invention, the re-growth process 16 may be performed with the mask layer 14M remaining.

Subsequently, a source region 18S, a drain region 18D, and a channel region 19 may be formed, as shown in FIG. 2E.

Figure 4:
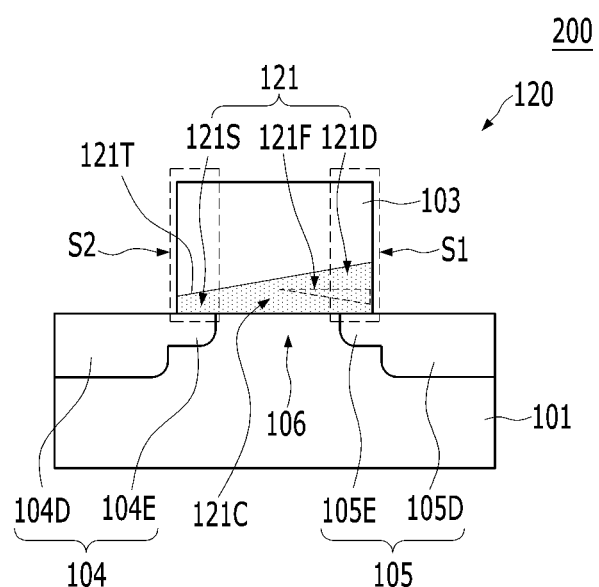
FIG. 4 is a cross-sectional view illustrating a semiconductor device in accordance with an embodiment of the present invention.

FIG. 4 is a cross-sectional view illustrating a semiconductor device 200 in accordance with another embodiment of the present invention. The semiconductor device 200 of FIG. 4 may include a gate structure 120. Some of the constituent elements of the semiconductor device 200 may be the same as those of the semiconductor device 100 of FIG. 1, except for a gate dielectric layer 121.

Referring to FIG. 4, the semiconductor device 200 may include a substrate 101, a gate electrode 103 over the substrate 101, a gate dielectric layer 121 between the substrate 101 and the gate electrode 103. The semiconductor device 200 may further include a source region 104 and a drain region 105 that are formed in the substrate 101.

The gate structure 120 may include a drain side S1 and a source side S2. The drain side S1 and the source side S2 of the gate structure 120 may refer to sidewall portions of the gate structure 120. The drain side S1 of the gate structure 120 may refer to a sidewall portion overlapping with the drain region 105, and the source side S2 of the gate structure 120 may refer to sidewall portion overlapping with the source region 104.

A channel region 106 may be formed in the substrate 101 between the drain side S1 and the source side S2 of the gate structure 120. The channel region 106 may overlap with the gate structure 120.

The gate dielectric layer 121 may have a non-uniform thickness. The gate dielectric layer 121 may be thicker on the drain side S1 of the gate structure 120 than on the source side S2. The gate dielectric layer 121 may include a drain-side gate dielectric layer 121D and a source-side gate dielectric layer 121S. The drain-side gate dielectric layer 121D may be formed on the drain side S1 of the gate structure 120, and the source-side gate dielectric layer 121S may be formed on the source side S2 of the gate structure 120. The drain-side gate dielectric layer 121D and the source-side gate dielectric layer 121S may have different thicknesses. The drain-side gate dielectric layer 121D may be thicker than the source-side gate dielectric layer 121S. Thus, the gate dielectric layer 121 having different thicknesses, that is, a non-uniform (or non-uniform thickness), may be referred to as an 'asymmetric gate dielectric layer'.

The gate dielectric layer 121 may locally include an oxidation promotion species 102F only to a portion of it. Specifically, the drain-side gate dielectric layer 121D may include an oxidation promotion species 121F, whereas the source-side gate dielectric layer 121S may not include the oxidation promotion species 121F.

The drain-side gate dielectric layer 121D may overlap with the drain region 105 and, in particular, with the shallow drain region 105E. The source-side gate dielectric layer 121S may overlap with the source region 104 and, in particular, with the shallow source region 104E.

The drain side S1 of the gate structure 120 may include an edge of the drain-side gate dielectric layer 121D. The edge of the drain-side gate dielectric layer 121D may overlap with a portion of the drain region 105 and, in particular, with the shallow drain region 105E. The source side S2 of the gate structure 120 may include an edge of the source-side gate dielectric layer 121S. The edge of the source-side gate dielectric layer 121S may overlap with a portion of the source region 104 and, in particular, with the shallow source region 104E.

The gate dielectric layer 121 may further include a channel-side gate dielectric layer 121C between the drain-side gate dielectric layer 121D and the source-side gate dielectric layer 121S. The channel-side gate dielectric layer 121C may be disposed between the drain side S1 and the source side S2 of the gate structure 120. The channel-side gate dielectric layer 121C may overlap with the channel region 106.

The gate dielectric layer 121 may have a thickness that gradually and continuously increases from the source side S2 toward the drain side S1. The thickness of the source-side gate dielectric layer 121S may gradually increase from the source side S2 toward the channel-side gate dielectric layer 121C. The thickness of the drain-side gate dielectric layer 121D may gradually increase from the channel-side gate dielectric layer 121C toward the drain side S1. The thickness between the source-side gate dielectric layer 121S and the drain-side gate dielectric layer 121D may vary to gradually increase from the source side S2 toward the drain side S1. As described, the thickness of the gate dielectric layer 121 may have a slope that increases from the source side S2 to the drain side S1.

The concentration of the oxidation promotion species 121F may gradually increase from the channel-side gate dielectric layer 121C toward the drain side S1. The concentration of the oxidation promotion species 121F in the drain-side gate dielectric layer 121D may have a gradient. For example, the concentration of the oxidation promotion species 121F may be lowest in the channel-side gate dielectric layer 121C and highest in the drain side S1. The gradual change in the thickness of the drain-side gate dielectric layer 121D may be in proportion to the concentration gradient of the oxidation promotion species 121F.

As described above, the gate dielectric layer 121 may be formed to have an asymmetric structure having a non-uniform thickness due to the oxidation promotion species 121F. The gate dielectric layer 121 of the asymmetric structure may be thicker on the drain side S1 of the gate structure 120 than in the source side S2 of the gate structure 120. This is turn, may allow a hot carrier effect to be reduced by reducing the vertical electric field between the drain region 105 and the gate electrode 103.

FIGS. 5A to 5D are cross-sectional views illustrating another example of a method for fabricating a semiconductor device. FIGS. 5A to 5D illustrate an example of a method for fabricating the semiconductor device 200 shown in FIG. 4.

Figure 5A:
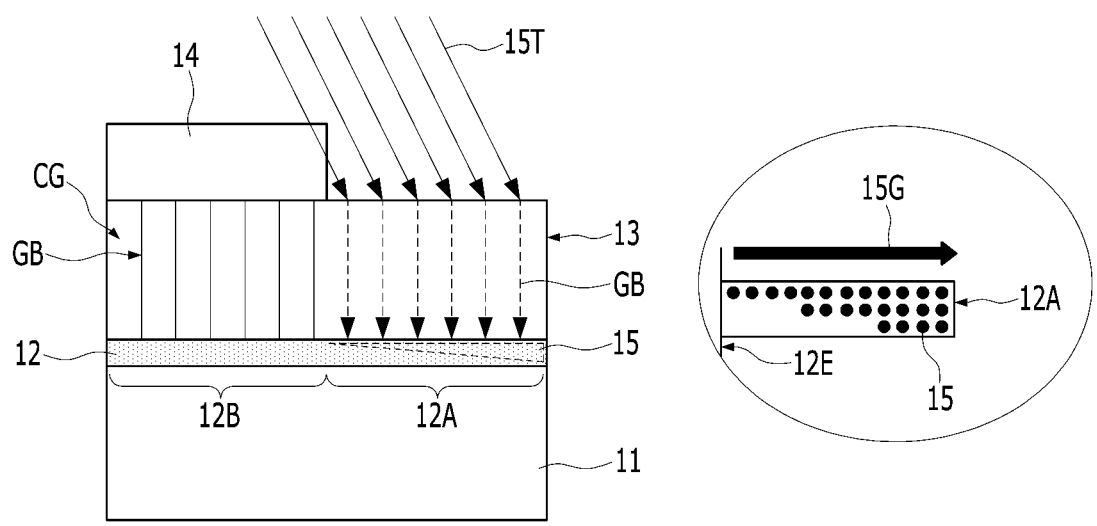
FIGS. 5A to 5D are cross-sectional views illustrating another example of a method for fabricating a semiconductor device.

First, referring to FIG. 5A, an initial gate dielectric layer 12 may be formed over a substrate 11. The initial gate dielectric layer 12 may, for example, include silicon oxide. The initial gate dielectric layer 12 may not be limited to silicon oxide. For example, the initial gate dielectric layer 12 may include silicon nitride, silicon oxynitride, a high-k material, or a combination thereof. In an embodiment, the initial gate dielectric layer 12 may be formed by thermal oxidation.

A gate conductive layer 13 may be formed over the initial gate dielectric layer 12. The gate conductive layer 13 may be formed to include a plurality of columnar crystal grains CG and grain boundaries GB.

Subsequently, a mask layer 14 may be formed over the gate conductive layer 13. The mask layer 14 may include a photoresist pattern. The mask layer 14 may cover only a portion of the gate conductive layer 13. The mask layer 14 may expose another portion of the gate conductive layer 13.

A doping process 15T may be performed. The doping process 15T may include a tilt implantation process and a post-annealing process that are sequentially performed with the post-annealing process following the implantation process. The doping process 15T may be performed on the exposed portion of the gate conductive layer 13. The exposed portion of the gate conductive layer 13 may be doped with an oxidation promotion species 15 by the doping process 15T. In an embodiment, the oxidation promotion species 15 may include fluorine (F).

The doping process 15T may be performed with the mask layer 14 used as a barrier. A selected portion 12A of the initial gate dielectric layer 12 may be doped with the oxidation promotion species 15. Here, the selected portion 12A of the initial gate dielectric layer 12 may refer to a portion doped with the oxidation promotion species 15, and an unselected portion 12B of the initial gate dielectric layer 12 may refer to a portion that is not doped with the oxidation promotion species. The oxidation promotion species 15 may be doped on the gate conductive layer 13 and the initial gate dielectric layer 12 by a tilt implantation process. Through the post-annealing process that is performed after the tilt implantation process, the oxidation promotion species 15 may be piled up on the interface between the selected portion 12A of the initial gate dielectric layer 12 and the gate conductive layer 13. The oxidation promotion species 15 may be piled up on the selected portion 12A of the initial gate dielectric layer 12. The oxidation promotion species 15 doped on the gate conductive layer 13 may be diffused into the selected portion 12A of the initial gate dielectric layer 12 along the grain boundaries GB of the gate conductive layer 13.

As described above, the oxidation promotion species 15 may be piled up on the selected portion 12A of the initial gate dielectric layer 12 by the doping process 15T of the oxidation promotion species 15. Since the gate conductive layer 13 includes columnar crystal grains CG and grain boundaries GB, the oxidation promotion species 15 may be diffused rapidly.

Hereinafter, the selected portion 12A of the initial gate dielectric layer 12 may be simply referred to as a 'doped initial gate dielectric layer 12A' as it is doped with the oxidation promotion species 15. The unselected portion 12B of the initial gate dielectric layer 12 may be simply referred to as an 'undoped initial gate dielectric layer 12B' as it is not doped with the oxidation promotion species 15. For example, when the oxidation promotion species 15 contains fluorine, the doped initial gate dielectric layer 12A may be a fluorine-doped initial gate dielectric layer. When the initial gate dielectric layer 12 includes silicon oxide, the doped initial gate dielectric layer 12A may be fluorine-doped silicon oxide. Fluorine-doped silicon oxide may also be referred to as fluorinated silicon oxide. The undoped initial gate dielectric layer 12B may include undoped silicon oxide.

The oxidation promotion species 15 may be piled up on the surface of the doped initial gate dielectric layer 12A.

The oxidation promotion species 15 doped on the selected portion 12A of the initial gate dielectric layer 12 may be graded 15G. For example, the concentration of the oxidation promotion species 15 may increase as a distance increases from a boundary region 12E between the selected region 12A and the unselected region 12B of the initial gate dielectric layer 12. The oxidation promotion species 15 may have the highest concentration at an edge of the selected region 12A of the initial gate dielectric layer 12. This grading 15G of the oxidation promotion species 15 may be controlled by with the tilt implantation process.

Figure 5B:
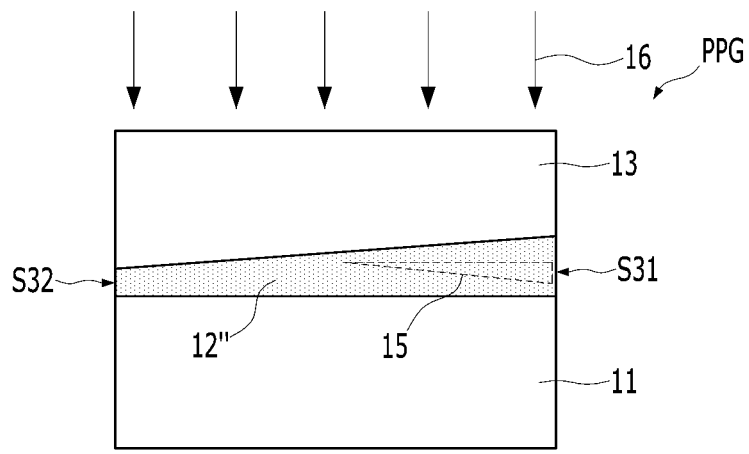

Referring to FIG. 5B, the mask layer 14 may be removed.

The pre-patterned gate structure PPG may be exposed to a re-growth process 16. The re-growth process 16 may be performed in an atmosphere of oxygen. The initial gate dielectric layer 12 may grow again by the re-growth process 16. While the re-growth process 16 is performed, the doped initial gate dielectric layer 12A may be re-oxidized to obtain a thickness that increases according to the concentration gradient of the oxidation promotion species 15.

A pre-patterned gate dielectric layer 12" may be formed by the re-growth process 16. The pre-patterned gate dielectric layer 12" may include a drain side S31 and a source side S32. The thickness of the drain side S31 may be greater than the thickness of the source side S32. The thickness of the pre-patterned gate dielectric layer 12" may increase continuously from the source side S32 to the drain side S31. The thickness of the asymmetric pre-patterned gate dielectric layer 12" may gradually increase from the source side S32 toward the drain side S31.

Figure 5C:
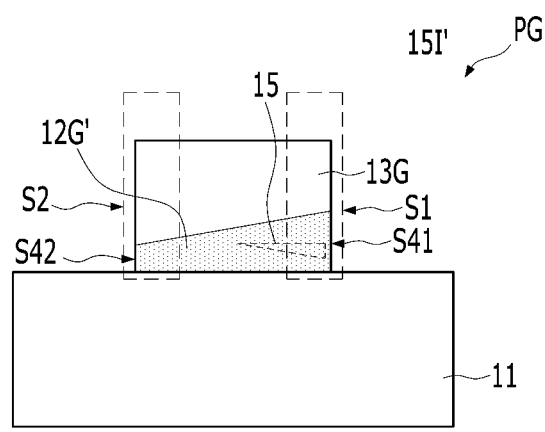

Referring to FIG. 5C, a patterned gate structure PG may be formed.

First, a gate electrode 13G may be formed. The gate electrode 13G may be formed by etching the gate conductive layer 13. For example, the gate conductive layer 13 may be etched by using a gate mask layer (not shown) as an etch barrier.

Subsequently, the pre-patterned gate dielectric layer 12" may be etched. As a result, a gate dielectric layer 12G' may be formed below the gate electrode 13G.

The patterned gate structure PG may include a drain side S1 and a source side S2.

The gate dielectric layer 12G' may have a non-uniform thickness which increases gradually in a direction from the source side S2 to the drain side S1. The gate dielectric layer 12G' may include a drain side S41 and a source side S42. The thickness of the drain side S41 may be greater than the thickness of the source side S42. The thickness of the gate dielectric layer 12G' may increase continuously from the source side S42 to the drain side S41. The thickness of the gate dielectric layer 12G' may gradually increase from the source side S42 toward the drain side S41.

Figure 5D:
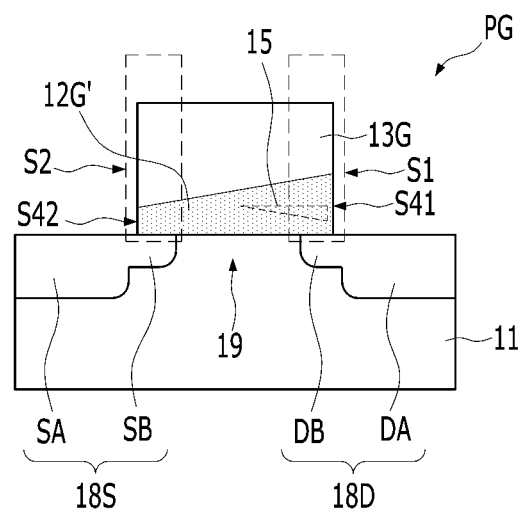

Referring to FIG. 5D, a source region 18S, a drain region 18D and a channel region 19 may be formed.

The patterned gate structure PG may be a stack of the gate dielectric layer 12G' and the gate electrode 13G. The patterned gate structure PG may include the drain side S1 and the source side S2. The gate dielectric layer 12G' may be formed to have an asymmetric structure with a gradually increasing thickness in a direction from the source side S2 to the drain side S1 due to the oxidation promotion species 15. The gate dielectric layer 12G' of the asymmetric structure may be thicker on the drain side S1 of the patterned gate structure PG.

The gate dielectric layer 12G' may include the drain side S41 and the source side S42. The drain side S41 may be disposed in the upper portion of the drain region 18D, and the source side S42 may be disposed in the upper portion of the source region 18S. The drain side S41 and the drain region 18D may overlap with each other, and the source side S42 and the source region 18S may overlap with each other. The thickness of the drain side S41 may be greater than the thickness of the source side S42. The thickness of the gate dielectric layer 12G' may continuously and gradually increase from the source side S42 toward the drain side S41.

Figure 6A:
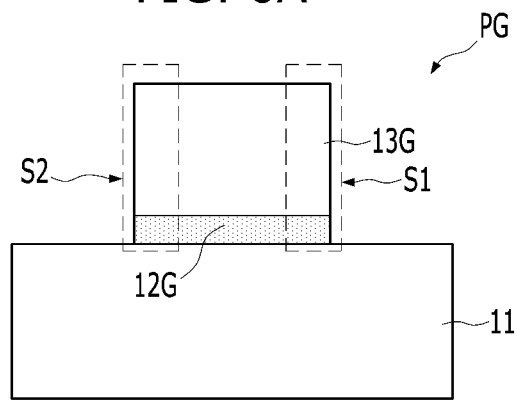
FIGS. 6A to 6C are cross-sectional views illustrating another example of a method for fabricating a semiconductor device.
Figure 6B:
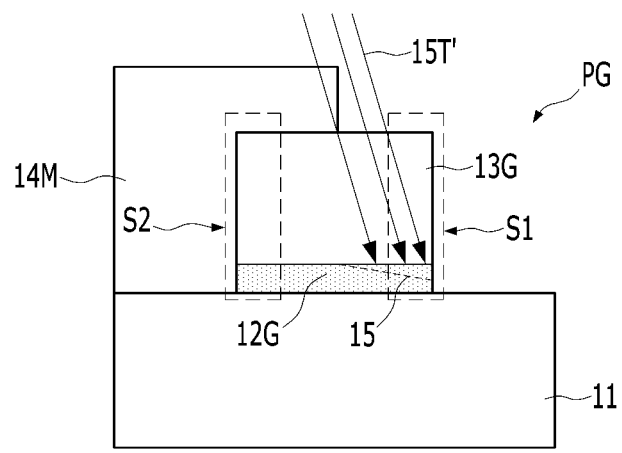
Figure 6C:
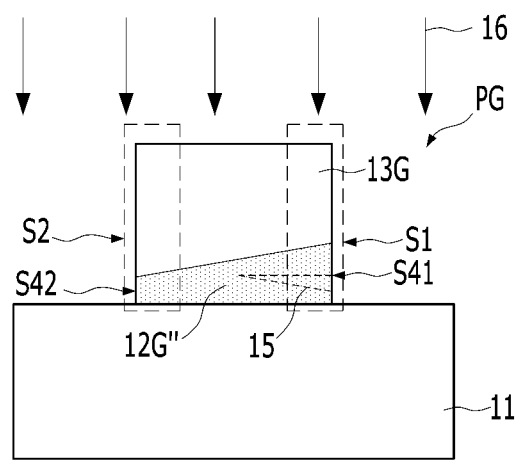

FIGS. 6A to 6C are cross-sectional views illustrating another example of a method for fabricating a semiconductor device. FIGS. 6A to 6C show an example of a method of fabricating the semiconductor device 200 of FIG. 4.

First, an initial gate dielectric layer 12 and a gate conductive layer 13 may be sequentially formed over a substrate 11, as shown in FIG. 5A. The gate conductive layer 13 may be formed to include a plurality of columnar crystal grains grain boundaries.

Subsequently, referring to FIG. 6A, a gate patterning process may be performed to form a patterned gate structure PG. Through the gate patterning process, a gate electrode 13G and a gate dielectric layer 12G may be formed. In order to form the gate electrode 13G, the gate conductive layer 13 may be etched by using an unillustrated gate mask as an etch barrier. Subsequently, to form the gate dielectric layer 12G, the initial gate dielectric layer 12 below the gate electrode 13G may be etched.

According to the embodiment of the present invention described above, a gate patterning process may be performed to form a patterned gate structure PG before a doping process of an oxidation promotion species.

The patterned gate structure PG may be a stack of the gate dielectric layer 12G and the gate electrode 13G. The patterned gate structure may include a drain side S1 and a source side S2.

Referring to FIG. 6B, a mask layer 14M may be formed over the gate electrode 13G. The mask layer 14M may include a photoresist pattern. The mask layer 14M may cover a portion of the gate electrode 13G. The mask layer 14M may expose another portion of the gate electrode 13G.

The doping process 15T' may include a tilt implantation process and a post-annealing process that are sequentially performed with the post-annealing process following the implantation process. The doping process 15T' may be performed by using the mask layer 14M as a barrier. A selected portion of the gate dielectric layer 12G may be doped with an oxidation promotion species 15 by the doping process 15T'. The oxidation promotion species 15 may be piled up on the surface of the gate dielectric layer 12G. The doping process 15T' may be performed in the same manner as the doping process 15T of FIG. 5A. In an embodiment, the oxidation promotion species 15 may contain fluorine (F).

As described above, the doping process 15T' may be performed selectively on the drain side S1 of the patterned gate structure PG.

Referring to FIG. 6C, the mask layer 14M may be removed.

The patterned gate structure PG doped with the oxidation promotion species 15 may be exposed to a re-growth process 16. The re-growth process 16 may be performed in an atmosphere of oxygen. The gate dielectric layer 12G may re-grow through the re-growth process 16. While the re-growth process 16 is performed, the doped portion of the oxidation promotion species 15 may be re-oxidized to be thick. A gate dielectric layer 12G" may be formed by the re-growth process 16.

A gate dielectric layer 12" may be formed by the re-growth process 16. The gate dielectric layer 12" may include a drain side S41 and a source side S42. The thickness of the drain side S41 may be greater than the thickness of the source side S42. The thickness of the gate dielectric layer 12" may gradually and continuously increase from the source side S42 to the drain side S41.

Subsequently, referring to FIG. 5D, a source region 18S and a drain region 18D may be formed. A channel region 19 may be defined between the source region 18S and the drain region 18D.

Figure 7:
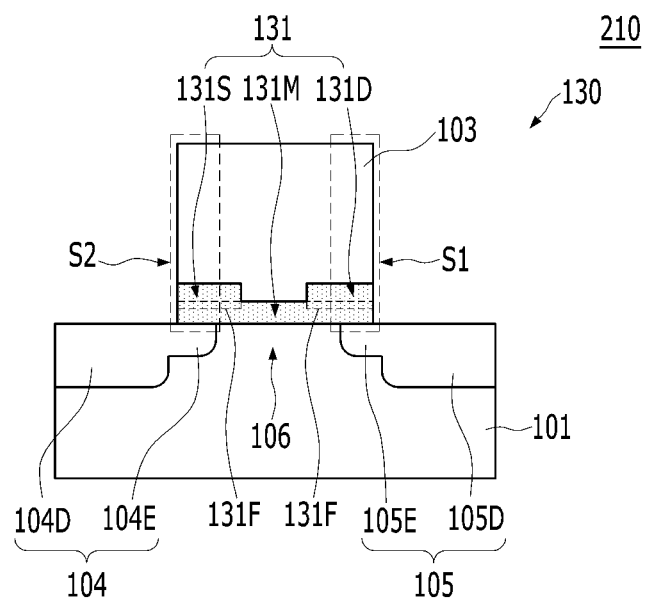
FIG. 7 is a cross-sectional view illustrating a semiconductor device in accordance with an embodiment of the present invention.

FIG. 7 is a cross-sectional view illustrating a semiconductor device 210 in accordance with another embodiment of the present invention.

The semiconductor device 210 of FIG. 7 may include a gate structure 130. Some of the constituent elements of the semiconductor device 210 may be the same as those of the semiconductor device 100 of FIG. 1A, except for the gate dielectric layer 131.

Referring to FIG. 7, the semiconductor device 210 may include a substrate 101, a gate electrode 103 over the substrate 101, and a gate dielectric layer 131 between the substrate 101 and the gate electrode 103. The semiconductor device 210 may further include a source region 104 and a drain region 105 that are formed in the substrate 101. The semiconductor device 210 may further include a channel region 106 disposed between the source region 104 and the drain region 105.

The gate structure 130 may include a drain side S1 and a source side S2. The drain side S1 and the source side S2 of the gate structure 130 may refer to sidewall portions of the gate structure 130. The drain side S1 of the gate structure 130 may refer to a sidewall portion overlapping with the drain region 105, and the source side S2 of the gate structure 130 may refer to a sidewall portion overlapping with the source region 104.

The channel region 106 may be formed in the substrate 101 between the drain side S1 and the source side S2 of the gate structure 130. The channel region 106 may overlap with the gate structure 130.

The gate dielectric layer 131 may have a non-uniform thickness. The gate dielectric layer 131 may be thicker on the drain side S1 and on the source side S2 of the gate structure 130 than on the channel side of the gate structure 130. The gate dielectric layer 131 may include a channel-side gate dielectric layer 131M between a drain-side gate dielectric layer 131D, and a source-side gate dielectric layer 131S. The drain-side gate dielectric layer 131D may be formed in the drain side S1 of the gate structure 130. The source-side gate dielectric layer 131S may be formed in the source side S2 of the gate structure 130. The drain-side gate dielectric layer 131D and the source-side gate dielectric layer 131S may have the same thickness. The drain-side gate dielectric layer 131D and the source-side gate dielectric layer 131S may be thicker than the channel-side gate dielectric layer 131M.

The gate dielectric layer 131 may locally include an oxidation promotion species 131F so that only the drain-side gate dielectric layer 131D and the source-side gate dielectric layer 131S may include the oxidation promotion species 131F, whereas the channel-side gate dielectric layer 131M may not include any oxidation promotion species 121F.

The drain-side gate dielectric layer 131D may overlap with the shallow drain region 105E. The source-side gate dielectric layer 131S may overlap with the shallow source region 104E.

The drain side S1 of the gate structure 130 may include an edge of the drain-side gate dielectric layer 131D. An edge of the drain-side gate dielectric layer 131D may overlap with a portion of the drain region 105. The source side S2 of the gate structure 130 may include an edge of the source-side gate dielectric layer 131S. The edge of the source-side gate dielectric layer 131S may overlap with a portion of the source region 104.

The channel-side gate dielectric layer 131M may be positioned between the drain side S1 and the source side S2 of the gate structure 130. The channel-side gate dielectric layer 131M may overlap with the channel region 106.

The concentration of the oxidation promotion species 131F in the drain-side gate dielectric layer 131D and the source-side gate dielectric layer 131S may be uniform and the same.

The drain-side gate dielectric layer 131D, the source-side gate dielectric layer 131S, and the channel-side gate dielectric layer 131M may have the same width. According to another embodiment of the present invention, the drain-side gate dielectric layer 131D and the source-side gate dielectric layer 131S may have a wider width than the channel-side gate dielectric layer 131M. According to another embodiment of the present invention, the drain-side gate dielectric layer 131D and the source-side gate dielectric layer 131S may have a smaller width than the channel-side gate dielectric layer 131M.

As described above, the gate dielectric layer 131 may be formed to have a non-uniform thickness due to the oxidation promotion species 131F. The gate dielectric layer 131 of the non-uniform thickness structure may have a thick thickness on the drain side S1 of the gate structure 130. Accordingly, by alleviating the vertical electric field between the drain region 105 and the gate electrode 103, the hot carrier effect may be reduced.

The gate dielectric layer 131 may be formed thicker on the drain side S1 and the source side S2 of the gate structure 130 than the channel side so that the gate-induced drain leakage (GIDL) stress and off stress may be suppressed.

FIGS. 8A to 8D are cross-sectional views illustrating an example of a method for fabricating a semiconductor device. FIGS. 8A to 8D show an example of a method of fabricating the semiconductor device 210 of FIG. 7.

Figure 8A:
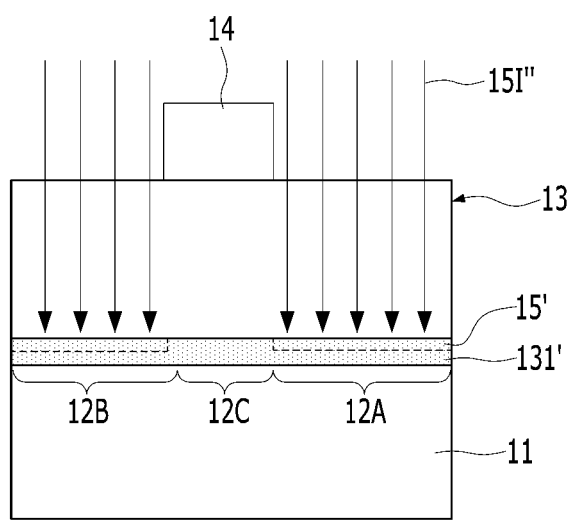
FIGS. 8A to 8D are cross-sectional views illustrating an example of a method for fabricating a semiconductor device.

Referring to FIG. 8A, an initial gate dielectric layer 12 (see 12A, 12B and 12C) may be formed over the substrate 11. The initial gate dielectric layer 12 may, for example, include silicon oxide. The initial gate dielectric layer 12 may not be limited to silicon oxide. For example, the initial gate dielectric layer 12 may include silicon nitride, silicon oxynitride, a high-k material, or a combination thereof. In an embodiment, the initial gate dielectric layer 12 may be formed by thermal oxidation.

A gate conductive layer 13 may be formed over the initial gate dielectric layer 12. The gate conductive layer 13 may be formed to include a plurality of columnar crystal grains CG (not shown) and grain boundaries GB (not shown) (see FIG. 2A).

Subsequently, a mask layer 14 may be formed over the gate conductive layer 13. The mask layer 14 may include a photoresist pattern. The mask layer 14 may cover only a portion of the gate conductive layer 13. The mask layer 14 may expose another portion of the gate conductive layer 13. The mask layer 14 may block only the channel side and expose the drain and source sides.

Then the doping process 15I" may be performed. The doping process 15I" may include an implantation process and a post-annealing process that are sequentially performed with the post-annealing process following the implantation process. The doping process 15I" may be performed on the exposed portions of the gate conductive layer 13. The exposed portions of the gate conductive layer 13 may be doped with an oxidation promotion species 15' by the doping process 15I". The oxidation promotion species 15' may include a material capable of selectively and rapidly re-oxidizing the initial gate dielectric layer 12 during a subsequent re-growth process. In an embodiment, the oxidation promotion species 15' may include fluorine (F).

The doping process 15I" may be performed with the mask layer 14 used as a barrier. Herein, the selected portions 12A and 12B of the initial gate dielectric layer 12 are doped with the oxidation promotion species 15', and the unselected portion 12C of the initial gate dielectric layer 12 is not doped with the oxidation promotion species 15'. The oxidation promotion species 15' may be doped on the gate conductive layer 13 and the initial gate dielectric layer 12 through an implantation process. Through a post-annealing process performed after the implantation process, the oxidation promotion species 15' may be piled up on the interface between the selected portion 12A and 12B of the initial gate dielectric layer 12 and the gate conductive layer 13. The oxidation promotion species 15' may be piled up on the selected portion 12A and 12B of the initial gate dielectric layer 12. The oxidation promotion species 15' doped on the gate conductive layer 13 may be diffused into the selected portion 12A and 12B of the initial gate dielectric layer 12 along the grain boundaries GB of the gate conductive layer 13.

As described above, the oxidation promotion species 15' may be piled up on the selected portion 12A and 12B of the initial gate dielectric layer 12 by the doping process 15I" of the oxidation promotion species 15'. The gate conductive layer 13 may include columnar crystal grains CG and grain boundaries GB which allows diffusing the oxidation promotion species 15' rapidly.

The selected portions 12A and 12B of the initial gate dielectric layer 12 may be simply referred to as 'a doped initial gate dielectric layer 12A and 12B' since the selected portion 12A and 12B of the initial gate dielectric layer 12 is doped with the oxidation promotion species 15'. The unselected portion 12C of the initial gate dielectric layer 12 may be simply referred to as 'an undoped initial gate dielectric layer 12C' since the unselected portion 12C of the initial gate dielectric layer 12 is not doped with the oxidation promotion species 15'. For example, when the oxidation promotion species 15' includes fluorine, the doped initial gate dielectric layer 12A and 12B may be a fluorine-doped initial gate dielectric layer. When the initial gate dielectric layer 12 includes silicon oxide, the doped initial gate dielectric layer 12A and 12B may be a fluorine-doped silicon oxide. Fluorine-doped silicon oxide may be also referred to as fluorinated silicon oxide. The undoped initial gate dielectric layer 12C may include undoped silicon oxide.

The oxidation promotion species 15' may be piled up on the surface of the doped initial gate dielectric layer 12A and 12B.

Figure 8B:
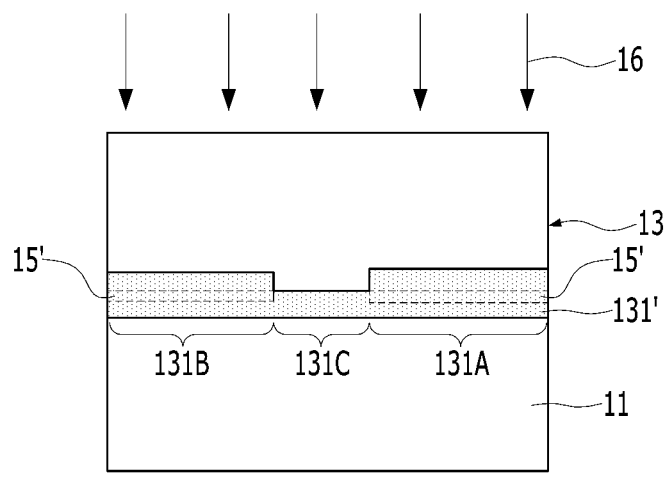

Referring to FIG. 8B, the mask layer 14 may be removed.

A re-growth process 16 may then be performed. The re-growth process 16 may be performed in an atmosphere of oxygen. Through the re-growth process 16, the doped portions of the initial gate dielectric layer 12A and 12B and the undoped portion of the initial gate dielectric layer 12C may re-grow. While the re-growth process 16 is performed, the doped portions of the initial gate dielectric layer 12A and 12B may be re-oxidized to be thicker than the undoped portion 12C due to the oxidation promotion species 15'.

A pre-patterned gate dielectric layer 131' may be formed by the re-growth process 16. The pre-patterned gate dielectric layer 131' may include a drain-side gate dielectric layer 131A, a source-side gate dielectric layer 131B, and a channel-side gate dielectric layer 131C disposed between the drain-side gate dielectric layer 131A and the source-side gate dielectric layer 131B. The pre-patterned gate dielectric layer 131' may be referred to as a non-uniform thickness gate dielectric layer.

The drain-side gate dielectric layer 131A and the source-side gate dielectric layer 131B may include an oxidation promotion species 15', and the channel-side gate dielectric layer 131C may not include an oxidation promotion species 15'.

Figure 8C:
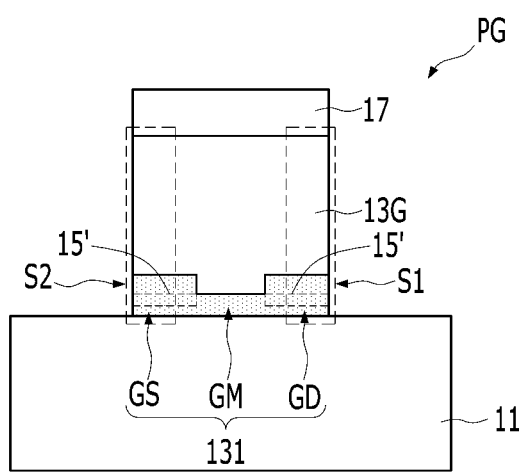

Referring to FIG. 8C, a patterned gate structure PG may be formed.

First, the gate electrode 13G may be formed. The gate electrode 13G may be formed by etching the gate conductive layer 13. For example, the gate conductive layer 13 may be etched by using an unillustrated gate mask as an etch barrier.

Subsequently, the pre-patterned gate dielectric layer 131' may be etched. Accordingly, a gate dielectric layer 131 may be formed below the gate electrode 13G. The gate dielectric layer 131 may include a drain-side gate dielectric layer GD, a source-side gate dielectric layer GS, and a channel-side gate dielectric layer GM. The drain-side gate dielectric layer GD and the source-side gate dielectric layer GS may include an oxidation promotion species 15', and the channel-side gate dielectric layer GM may not include the oxidation promotion species 15'. The drain-side gate dielectric layer GD and the source-side gate dielectric layer GS may have the same thickness, and the thickness of the channel-side gate dielectric layer GM may be thinner than the thicknesses of the drain-side gate dielectric layer GD and the source-side gate dielectric layer GS.

Figure 8D:
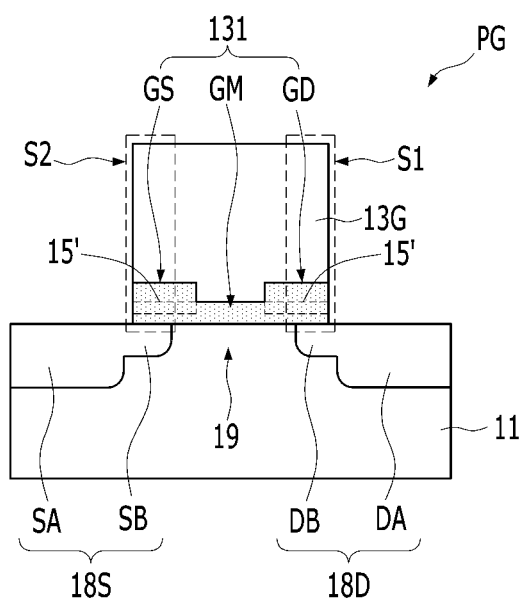

Subsequently, as shown in FIG. 8D, a source region 18S and a drain region 18D may be formed. A channel region 19 may be defined between the source region 18S and the drain region 18D.

Figure 9:
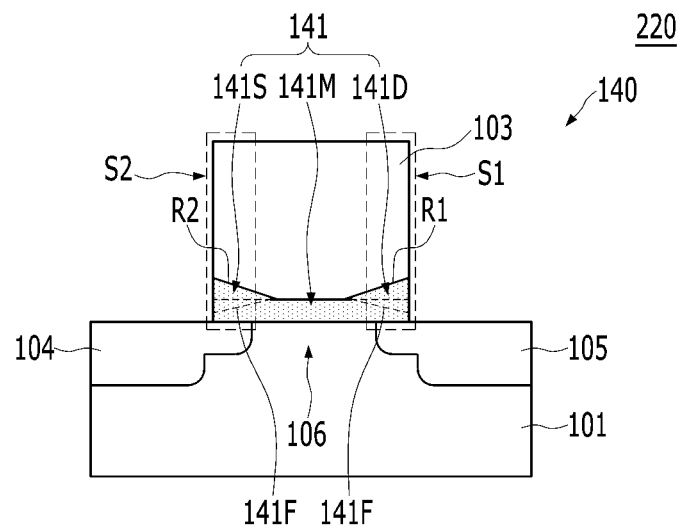
FIG. 9 is a cross-sectional view illustrating a semiconductor device in accordance with an embodiment of the present invention.

FIG. 9 is a cross-sectional view illustrating a semiconductor device in accordance with another embodiment of the present invention. The semiconductor device 220 of FIG. 9 may include a gate structure 140. Some of the constituent elements of the semiconductor device 220 may be the same as those of the semiconductor device 210 of FIG. 7 except for the gate dielectric layer 141.

Referring to FIG. 9, the semiconductor device 220 may include a gate structure 140. The gate structure 140 may include a gate electrode 103 over the substrate 101 and a gate dielectric layer 141 between the substrate 101 and the gate electrode 103. The gate structure 140 may include a drain side S1 and a source side S2.

The gate dielectric layer 141 may have a non-uniform thickness. The gate dielectric layer 141 may include a drain-side gate dielectric layer 141D and a source-side gate dielectric layer 141S. The gate dielectric layer 141 may further include a channel-side gate dielectric layer 141M between the drain-side gate dielectric layer 141D and the source-side gate dielectric layer 141S.

The drain-side gate dielectric layer 141D and the source-side gate dielectric layer 141S may have the same thickness, and the channel-side gate dielectric layer 141M may be thinner than the drain-side gate dielectric layer 141D and the source-side gate dielectric layer 141S.

The gate dielectric layer 141 may locally include an oxidation promotion species 141F. The drain-side gate dielectric layer 141D and the source-side gate dielectric layer 141S may include the oxidation promotion species 141F, and the channel-side gate dielectric layer 141M may not include the oxidation promotion species 141F. Moreover, the concentration of the oxidation promotion species 141F may be graded in the drain-side gate dielectric layer 141D. Also, the concentration of the oxidation promotion species 141F may be graded in the source-side gate dielectric layer 141S. More specifically, the concentration of the oxidation promotion species 141F may be the highest at the outer edges of the drain-side gate dielectric layer 141D and of the source-side gate dielectric layer 141S farthest from the channel-side gate dielectric layer 141M. The drain-side gate dielectric layer 141D and the source-side gate dielectric layer 141S may have the same concentration of the oxidation promotion species 141F. The thickness of the drain-side gate dielectric layer 141D may have a slope R1 that increases in a direction from the channel-side gate dielectric layer 141M toward the drain side S1. The thickness of the source-side gate dielectric layer 141S may have a slope R2 that increases in a direction from the channel-side gate dielectric layer 141M toward the source side S2. The slopes R1 and R2 may have the same magnitude but the thicknesses of the drain-side gate dielectric layer 141D and of the source-side gate dielectric layer 141S increase linearly in opposite directions.

As described above, the gate dielectric layer 141 may be formed to have a non-uniform thickness due to the oxidation promotion species 141F. The gate dielectric layer 141 may have a thickness that is thick on the drain side S1 of the gate structure 140. Accordingly, by alleviating the vertical electric field between the drain region 105 and the gate electrode 103, the hot carrier effect may be reduced.

In addition, according to the embodiment of the present invention, the gate-induced drain leakage stress and off-stress may be suppressed by forming the thick gate dielectric layer 141 to be thick on the drain side S1 and the source side S2 of the gate structure 140.

Figure 10A:
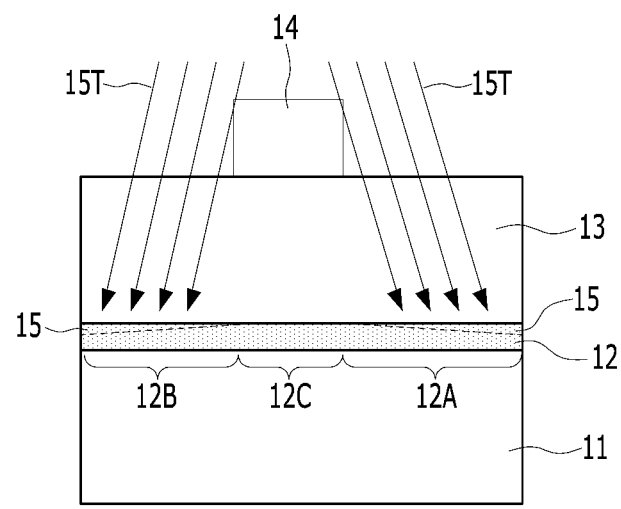
FIGS. 10A to 10C are cross-sectional views illustrating an example of a method for forming a non-uniform thickness gate dielectric layer 141.
Figure 10B:
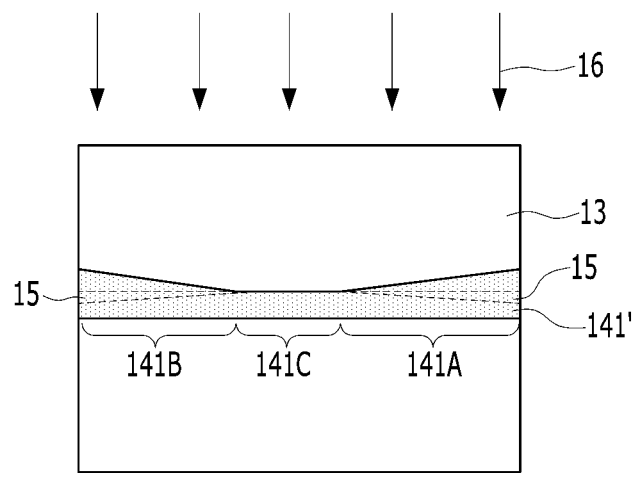
Figure 10C:
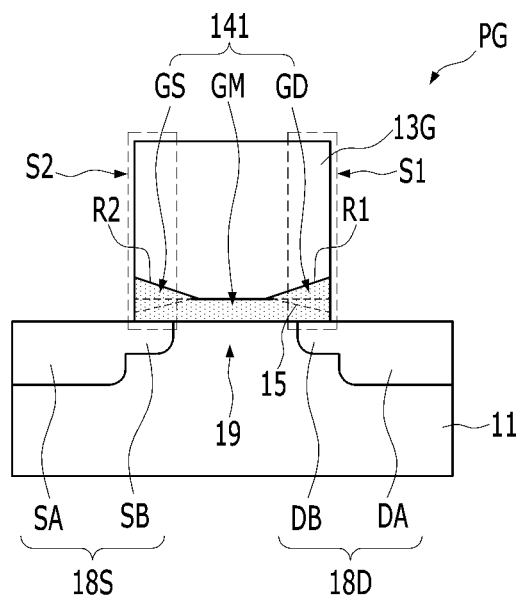

FIGS. 10A to 10C are cross-sectional views illustrating an example of a method for forming the non-uniform thickness gate dielectric layer 141 of FIG. 9.

Referring to FIG. 10A, an initial gate dielectric layer 12 and a gate conductive layer 13 may be sequentially formed over a substrate 11.

A mask layer 14 may be formed over the gate conductive layer 13. The mask layer 14 may include a photoresist pattern. The mask layer 14 may cover only a portion of the gate conductive layer 13. The mask layer 14 may expose another portion of the gate conductive layer 13. The mask layer 14 may cover the central portion of the gate conductive layer 13, and expose both side portions of the central portion. The central portion of the gate conductive layer 13 may correspond to the channel side, and the side portions may correspond to the drain side and the source side.

The doping process 15T may be performed. The doping process 15T may include a tilt implantation process and a post-annealing that are sequentially performed with the post-annealing process following the tilt implantation process. The doping process 15T may be performed on the exposed portions of the gate conductive layer 13. The exposed portions of the gate conductive layer 13 may be doped with an oxidation promotion species 15 by the doping process 15T. In an embodiment, the oxidation promotion species 15 may include fluorine (F).

The doping process 15T may be performed with the mask layer 14 used as a barrier. Selected portions of the initial gate dielectric layer 12 may be doped with the oxidation promotion species 15. The selected portions 12A and 12B of the initial gate dielectric layer 12 may be doped with the oxidation promotion species 15, and the un-selected portion 12C of the initial gate dielectric layer 12 may not be doped with the oxidation promotion species 15. The oxidation promotion species 15 may be doped on the gate conductive layer 13 and the initial gate dielectric layer 12 by the tilt implantation process. Through the post-annealing process performed after the tilt implantation process, the oxidation promotion species 15 may be piled up on the interface between each of the selected portions 12A and 12B of the initial gate dielectric layer 12 and the gate conductive layer 13. The oxidation promotion species 15 may be piled up on the selected portions 12A and 12B of the initial gate dielectric layer 12. The oxidation promotion species 15 doped on the gate conductive layer 13 may be diffused into the selected portions 12A and 12B of the initial gate dielectric layer 12 along the grain boundaries GB of the gate conductive layer 13.

As described above, the oxidation promotion species 15 may be piled up on the selected portions 12A and 12B of the initial gate dielectric layer 12 by the doping process 15T of the oxidation promotion species 15. Since the gate conductive layer 13 includes columnar crystal grains CG and grain boundaries GB, the oxidation promotion species 15 may be rapidly diffused.

Referring to FIG. 10B, the mask layer 14 may be removed.

A re-growth process 16 may be performed. The re-growth process 16 may be performed in an atmosphere of oxygen. The initial gate dielectric layer 12 may re-grow through the re-growth process 16. While the re-growth process 16 is performed, the portion doped with the oxidation promotion species 15 may be re-oxidized to be thicker than the undoped portion.

A pre-patterned gate dielectric layer 141' may be formed by the re-growth process 16. The pre-patterned gate dielectric layer 141' may include a drain-side gate dielectric layer 141A, a source-side gate dielectric layer 141B, and a channel-side gate dielectric layer 141C disposed between the drain-side gate dielectric layer 141A and the source-side gate dielectric layer 141B.

The drain-side gate dielectric layer 141A and the source-side gate dielectric layer 141B may include the oxidation promotion species 15, and the channel-side gate dielectric layer 141C may not include the oxidation promotion species 15.

Referring to FIG. 10C, a patterned gate structure PG may be formed.

First, the gate electrode 13G may be formed. The gate electrode 13G may be formed by etching the gate conductive layer 13. For example, the gate conductive layer 13 may be etched by using an unillustrated gate mask as an etch barrier.

Subsequently, the pre-patterned gate dielectric layer 141' may be etched. Accordingly, a gate dielectric layer 141 may be formed below the gate electrode 13G. The gate dielectric layer 141 may include a drain-side gate dielectric layer GD, a source-side gate dielectric layer GS, and a channel-side gate dielectric layer GM. The drain-side gate dielectric layer GD and the source-side gate dielectric layer GS may contain the oxidation promotion species 15, and the channel-side gate dielectric layer GM may not include the oxidation promotion species 15. The drain-side gate dielectric layer GD and the source-side gate dielectric layer GS may have the same thickness, and the channel-side gate dielectric layer GM may be thinner than the drain-side gate dielectric layer GD and the source-side gate dielectric layer GS. The thickness of the drain-side gate dielectric layer GD may have a slope R1 that increases in a direction toward the drain side S1. The thickness of the source-side gate dielectric layer GS may have a slope R2 that increases in a direction toward the source side S2. The slopes R1 and R2 may be controlled by controlling the concentration gradient of the oxidation promotion species in the respective drain-side and source side gate dielectric layers 141D and 141S.

Subsequently, a source region 18S and a drain region 18D may be formed. A channel region 19 may be defined between the source region 18S and the drain region 18D.

Figure 11:
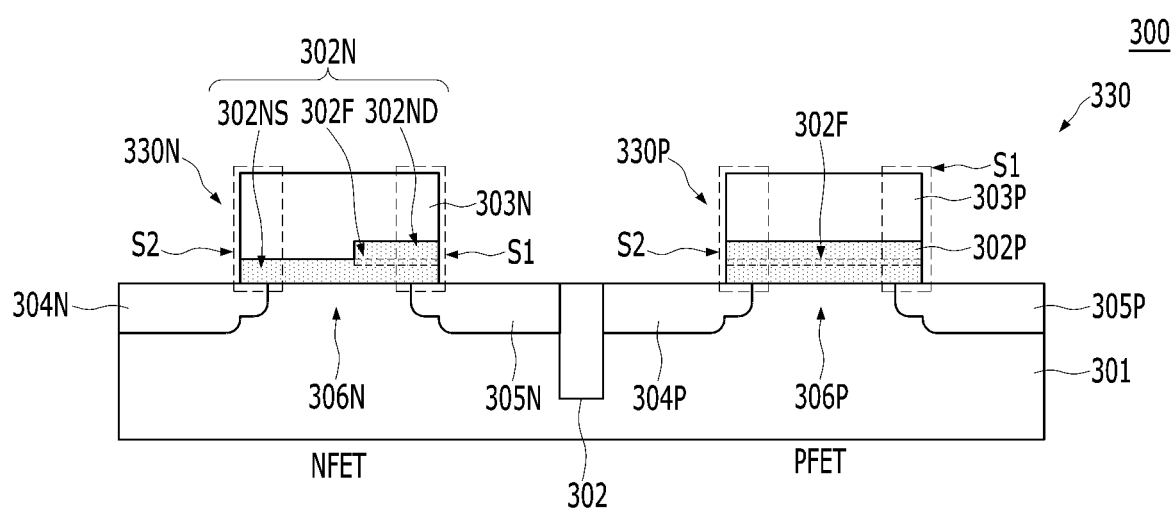
FIG. 11 is a cross-sectional view illustrating a semiconductor device in accordance with an embodiment of the present invention.

FIG. 11 is a cross-sectional view illustrating a semiconductor device in accordance with another embodiment of the present invention. The semiconductor device 300 of FIG. 11 may include an integrated circuit 330 that includes a plurality of transistors. For example, the integrated circuit 330 may include an NFET and a PFET. The NFET and the PFET may be isolated from each other by an isolation layer 302.

The integrated circuit 330 may include a plurality of gate structures 330N and 330P. The gate structures 330N and 330P may include an NFET gate structure 330N and a PFET gate structure 330P. Each of the NFET gate structure 330N and the PFET gate structure 330P may include a drain side S1 and a source side S2.

The NFET gate structure 330N may include an asymmetric gate dielectric layer 302N and an N-type gate electrode 303N. An N-type source region 304N and an N-type drain region 305N may be formed in a substrate 301 on both sides of the NFET gate structure 330N. An N-channel region 306N may be formed between the N-type source region 304N and the N-type drain region 305N. The asymmetric gate dielectric layer 302N may include a drain-side gate dielectric layer 302ND, a source-side gate dielectric layer 302NS which is thinner than the drain-side gate dielectric layer 302ND, and oxidation promotion species 302F. The drain-side gate dielectric layer 302ND may include the oxidation promotion species 302F, and the source-side gate dielectric layer 302NS may not include the oxidation promotion species 302F.

The PFET gate structure 330P may include a thick gate dielectric layer 302P and a P-type gate electrode 303P. A source region 304P and a drain region 305P may be formed in the substrate 301 on both sides of the PFET gate structure 330P. A P-channel region 306P may be formed between the P-type source region 304P and the P-type drain region 305P. The thick gate dielectric layer 302P may have a uniform thickness and may include the oxidation promotion species 302F in a uniform concentration. The thick gate dielectric layer 302P may have the same thickness on the drain side S1 and the source side S2. The thick gate dielectric layer 302P and the drain-side gate dielectric layer 302ND may be of the same thickness. The thick gate dielectric layer 302P may be thicker than the source-side gate dielectric layer 302NS.

Figure 12:
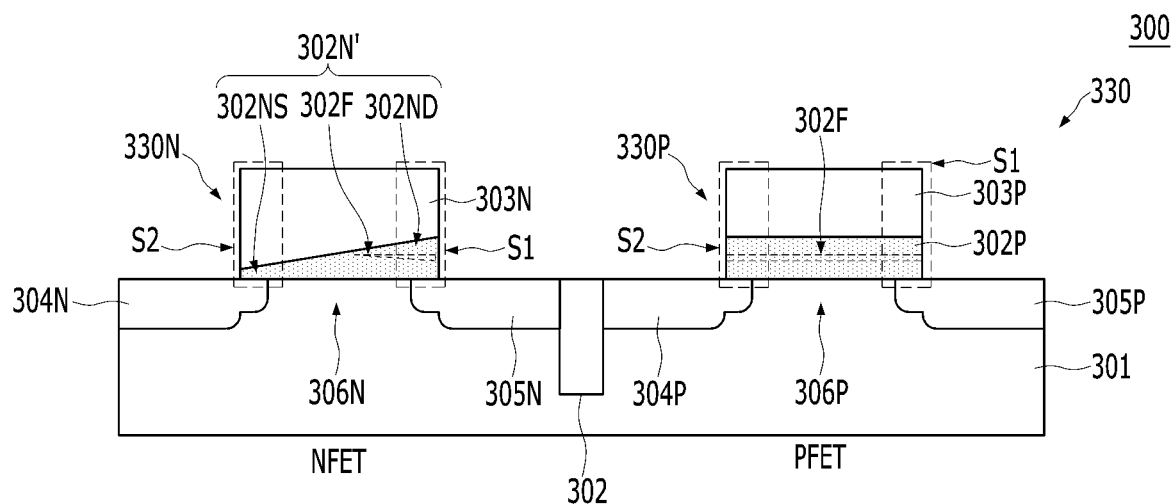
FIG. 12 is a cross-sectional view illustrating a semiconductor device in accordance with an embodiment of the present invention.

FIG. 12 is a cross-sectional view illustrating a semiconductor device in accordance with another embodiment of the present invention. The semiconductor device 400 of FIG. 12 may include an integrated circuit 330 including a plurality of transistors. For example, the integrated circuit 330 may include an NFET and a PFET.

The integrated circuit 330 may include a plurality of gate structures 330N and 330P. The gate structures 330N and 330P may include an NFET gate structure 330N and a PFET gate structure 330P. Each of the NFET gate structure 330N and the PFET gate structure 330P may include a drain side S1 and a source side S2.

The NFET gate structure 330N may include an asymmetric gate dielectric layer 302N' and an N-type gate electrode 303N. The source region 304N and the drain region 305N may be formed in the substrate 301 on both sides of the NFET gate structure 330N. An N-channel region 306N may be formed between the source region 304N and the drain region 305N. The asymmetric gate dielectric layer 302N' may include a drain-side gate dielectric layer 302ND, a source-side gate dielectric layer 302NS which is thinner than the drain-side gate dielectric layer 302ND, and oxidation promotion species 302F. The drain-side gate dielectric layer 302ND may include the oxidation promotion species 302F. The gate dielectric layer 302N' may have a thickness that gradually and continuously increases in a direction from the source side S2 toward the drain side S1.

The PFET gate structure 330P may include a thick gate dielectric layer 302P and a P-type gate electrode 303P. A source region 304P and a drain region 305P may be formed in the substrate 301 on both sides of the PFET gate structure 330P. A P-channel region 306P may be formed between the source region 304P and the drain region 305P. The thick gate dielectric layer 302P may have a uniform thickness and may include a uniform concentration of the oxidation promotion species 302F.

Referring to FIGS. 11 and 12, the N-type gate electrode 303N may include an N-type dopant, and the P-type gate electrode 303P may include a P-type dopant.

The asymmetric gate dielectric layers 302N and 302N' of FIGS. 11 and 12 may correspond to the asymmetric gate dielectric layer in accordance with the above-described embodiments of the present invention.

The asymmetric gate dielectric layer 302N and 302N' may have a thick thickness on the drain side S1 of the NFET gate structure 330N due to the oxidation promotion species 302F.

The thick gate dielectric layer 302P may have a thick thickness on the drain side S1 and the source side S2 of the PFET gate structure 330P due to the oxidation promotion species 302F.

Figure 13A:
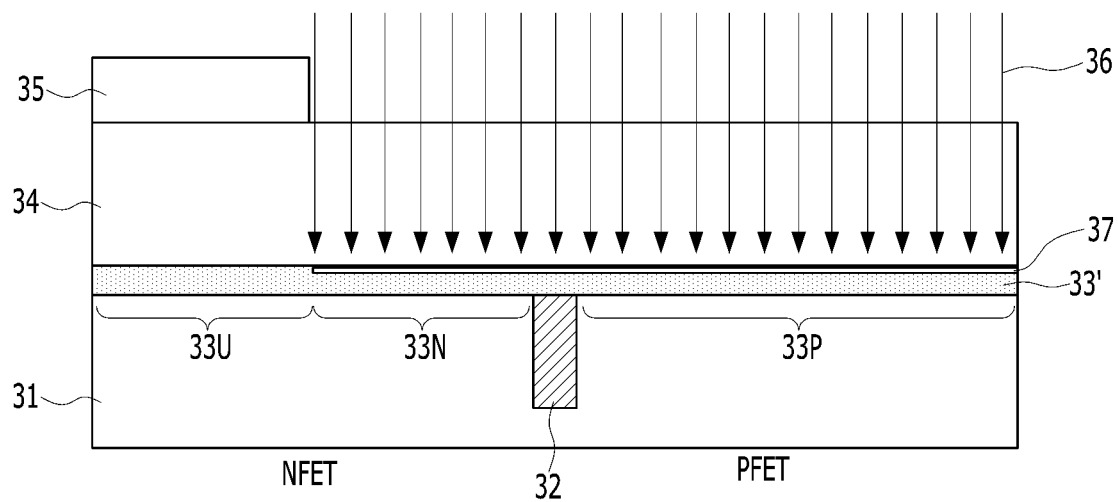
FIGS. 13A and 13B are cross-sectional views illustrating a method for fabricating the semiconductor device shown in FIGS. 11 and 12.
Figure 13B:
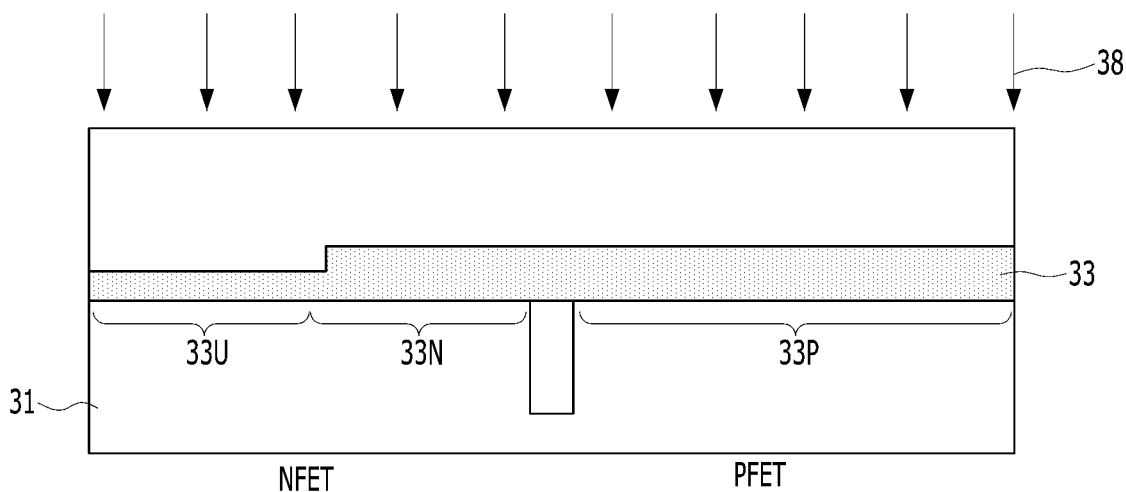

FIGS. 13A and 13B are cross-sectional views illustrating a method for fabricating the semiconductor device 300 shown in FIGS. 11 and 12.

Referring to FIG. 13A, an NFET region and a PFET region may be defined in the substrate 31. The NFET region and the PFET region may be isolated by the isolation layer 32. The isolation layer 32 may be formed by a Shallow Trench Isolation (STI) process.

An initial gate dielectric layer 33' may be formed over the substrate 31. The initial gate dielectric layer 33' may, for example, include silicon oxide. The initial gate dielectric layer 33' may not be limited to silicon oxide. For example, the initial gate dielectric layer 33' may include silicon nitride, silicon oxynitride, a high-k material, or a combination thereof. In an embodiment, the initial gate dielectric layer 33' may be formed by thermal oxidation.

A gate conductive layer 34 may be formed over the initial gate dielectric layer 33'. The gate conductive layer 34 may include a plurality of columnar crystal grains CG and grain boundaries GB. For example, the gate conductive layer 34 may include columnar crystal grain polysilicon. The columnar crystal grain polysilicon may include a dopant. For example, the columnar crystal grain polysilicon of the NFET region may include an N-type dopant, and the columnar crystal grain polysilicon of the PFET region may include a P-type dopant.

Subsequently, a mask layer 35 may be formed over the gate conductive layer 34. The mask layer 35 may include a photoresist pattern. The mask layer 35 may cover only a portion of the gate conductive layer 34 and may expose another portion of the gate conductive layer 35.

A doping process 36 may then be performed. The doping process 36 may include an implantation process and a post-annealing process that are sequentially performed with the post-annealing process following the implantation process. The doping process 36 may be performed on the exposed portion of the gate conductive layer 34. The exposed portion of the gate conductive layer 34 may be doped with an oxidation promotion species 37 by the doping process 36. In an embodiment, the oxidation promotion species 37 may contain fluorine (F).

As described above, the oxidation promotion species 37 may be piled up on selected portions 33N and 33P of the initial gate dielectric layer 33' by the doping process 36 of the oxidation promotion species 37. Since the gate conductive layer 34 includes columnar crystal grains CG and grain boundaries GB, the oxidation promotion species 37 may be rapidly diffused. The selected portions 33N and 33P of the initial gate dielectric layer 33' may include a portion 33N located in the NFET region and a portion 33P located in the PFET region. The NFET region may further include an undoped portion 33U which is not doped with the oxidation promotion species 37.

Referring to FIG. 13b, the mask layer 14 may be removed.

A re-growth process 38 may be performed. The re-growth process 38 may be performed in an atmosphere of oxygen. The initial gate dielectric layer 33 may re-grow through the re-growth process 38. While the re-growth process 38 is performed, the portions doped with the oxidation promotion species 37 may be re-oxidized to be thicker than the undoped portion.

Through the regrowth process 38, a pre-patterned gate dielectric layer 33 may be formed. The pre-patterned gate dielectric layer 33 may have a non-uniform thickness.

Subsequently, a gate patterning process may be performed on the pre-patterned gate dielectric layer 33 and the gate conductive layer 34 in order to form a patterned gate structure. After the gate patterning process, a source region and a drain region may be formed.

As a result, a plurality of transistors may be formed as illustrated in FIGS. 11 and 12.

Figure 14:
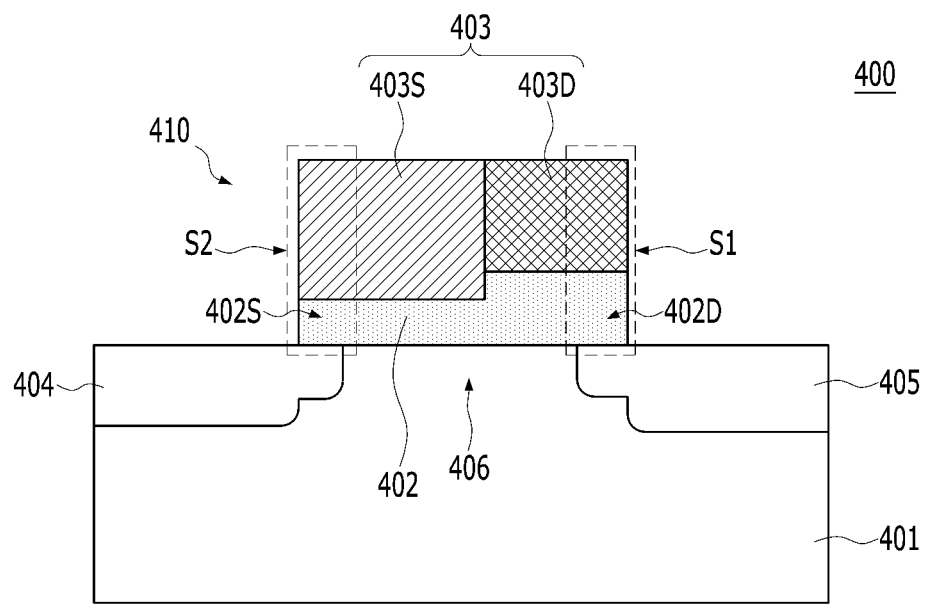
FIG. 14 is a cross-sectional view illustrating a transistor in accordance with an embodiment of the present invention.

FIG. 14 is a cross-sectional view illustrating a semiconductor device in accordance with another embodiment of the present invention.

Referring to FIG. 14, the semiconductor device 400 may include a gate structure 410 formed over a substrate 401, and the gate structure 410 may include a drain side S1 and a source side S2. The gate structure 410 may include a gate electrode 403 over the substrate 401, and a gate dielectric layer 402 between the substrate 401 and the gate electrode 403. The semiconductor device 400 may further include a source region 404 and a drain region 405 that are formed in the substrate 401. The semiconductor device 400 may further include a channel region 406 between the source region 404 and the drain region 405.

In the gate structure 410, the gate dielectric layer 402 may have an asymmetric structure with a non-uniform thickness. The gate dielectric layer 402 may include a drain-side gate dielectric layer 402D and a source-side gate dielectric layer 402S. The drain-side gate dielectric layer 402D may be thicker than the source-side gate dielectric layer 402S. A thick drain-side gate dielectric layer 402D may be formed on the drain side S1 of the gate structure 410.

The gate electrode 403 may have a non-uniform crystal grain structure. The gate electrode 403 may include a drain-side gate electrode 403D and a source-side gate electrode 403S. The drain-side gate electrode 403D may have a columnar crystal grain structure, and the source-side gate electrode 403S may have a columnar crystal grain structure and a non-columnar crystal grain structure. The non-columnar crystal grain structure may include a polycrystalline structure or a single crystal structure. The drain-side gate electrode 403D may include polysilicon of a columnar crystal grain structure. The source-side gate electrode 403S may include polysilicon of a polycrystalline or single crystal structure. The gate electrode 403 may have a non-uniform thickness.

Figure 15:
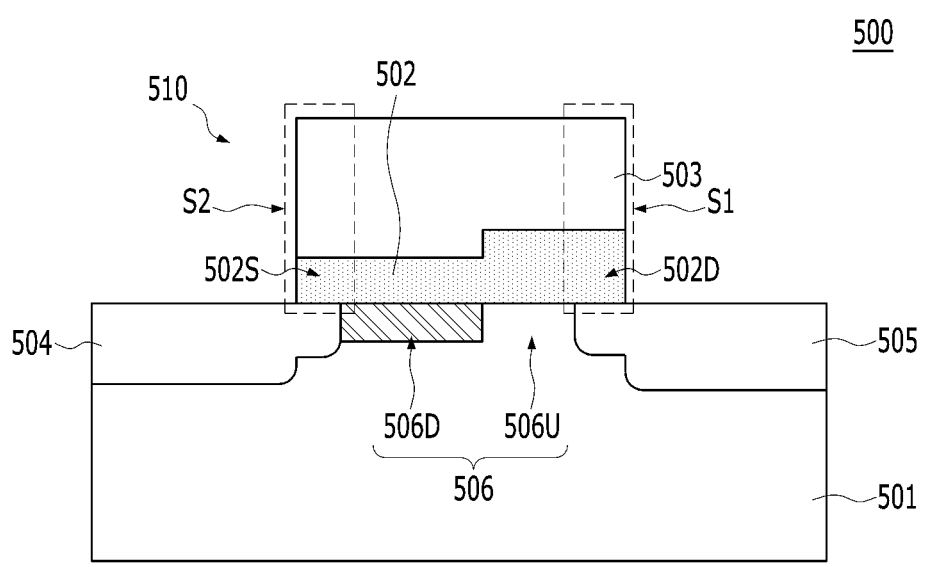
FIG. 15 is a cross-sectional view illustrating a transistor in accordance with an embodiment of the present invention.

FIG. 15 is a cross-sectional view illustrating a semiconductor device in accordance with another embodiment of the present invention.

Referring to FIG. 15, the semiconductor device 500 may include a gate structure 510 over a substrate 501, and the gate structure 510 may include a drain side S1 and a source side S2.

The gate structure 510 may include a gate electrode 503 over the substrate 501, and a gate dielectric layer 502 between the substrate 501 and the gate electrode 503. The semiconductor device 500 may further include a source region 504 and a drain region 505 that are formed in the substrate 501. The semiconductor device 500 may further include a channel region 506 between the source region 504 and the drain region 505.

The gate dielectric layer 502 of the gate structure 510 may have an asymmetric structure with a non-uniform thickness. The gate dielectric layer 502 may include a drain-side gate dielectric layer 502D and a source-side gate dielectric layer 502S. The drain-side gate dielectric layer 502D may be thicker than the source-side gate dielectric layer 502S. A thick drain-side gate dielectric layer 502D may be formed on the drain side S1 of the gate structure 510.

The gate electrode 503 may have a columnar crystal grain structure. The gate electrode 503 may include polysilicon of a columnar crystal grain structure.

In FIG. 15, the channel region 506 may include a doped channel 506D. The doped channel 506D may include a P-type dopant. The doped channel 506D may be in direct contact with the source region 504. The doped channel 506D may not be in direct contact with the drain region 505. The drain-side gate dielectric layer 502D and the doped channel 506D may not overlap in the vertical direction. A channel impurity 506U of a concentration lower than that of the doped channel 506D may be disposed in the channel region 506 between the doped channel 506D and the drain region 505. Thus, the channel region 506 may be an asymmetric channel. To form the asymmetric channel region 506, channel doping of the P-type dopant may be performed. Channel doping may be performed on the substrate 501 prior to formation of the initial gate dielectric layer (see FIG. 2A). For example, after the drain-side mask is formed over the substrate 501 to form the doped channel 506D, the P-type dopant may be doped. At this time, the drain-side mask may block a portion of the substrate 501 corresponding to the drain side S1 and the drain region 505 of the gate structure 510. A source-side mask that blocks a portion of the substrate 501 corresponding to the source side S2 and the source region 504 of the gate structure 510 may be used in order to dope the channel impurity 506U with a lower concentration.

As described above, a channel dose of the channel region 506 which is close to the drain region 505 may be reduced by forming the doped channel 506D which is spaced apart from the drain region 505. When the channel dose is reduced, the lateral electric field may be further reduced.

The gate dielectric layer 502 of FIG. 15 may be formed by any one among the above-described embodiments of the present invention.

Whereas the thickness of the drain-side gate dielectric layer is increased by doping the oxidation promotion species in accordance with the above embodiments of the present invention, the source-side gate dielectric layer may be doped with an oxidation inhibition species in accordance with other embodiments of the present invention. The drain-side gate dielectric layer may be formed to be thicker by inhibiting the re-growth of the source-side gate dielectric layer with the oxidation inhibition species. Suitable oxidation inhibition species may include nitrogen.

Figure 16A:
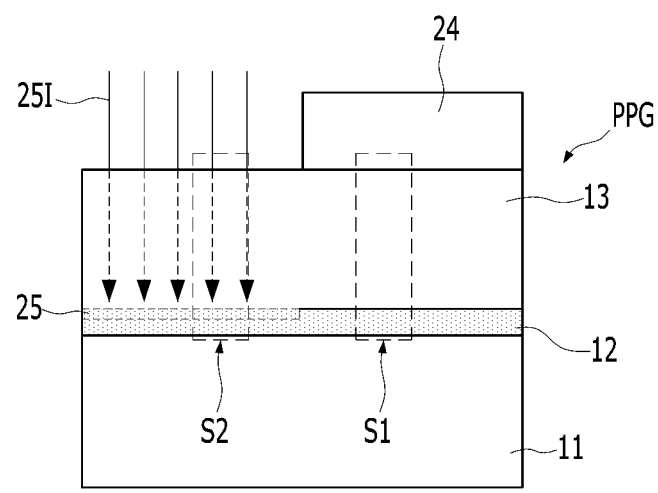
FIGS. 16A and 16B are cross-sectional views illustrating a method for fabricating a semiconductor device in accordance with an embodiment of the present invention.
Figure 16B:
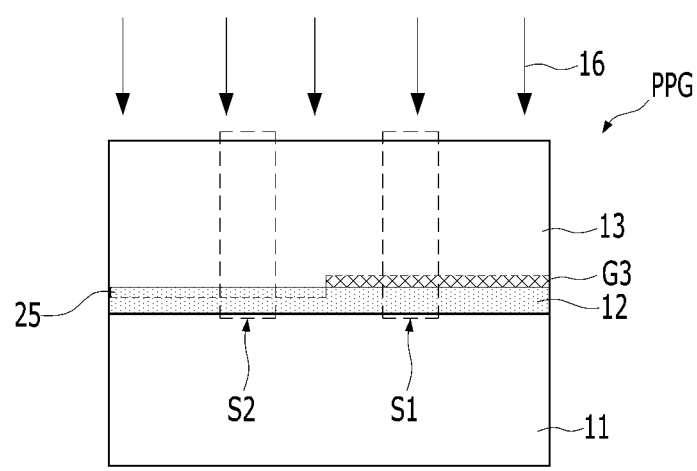

FIGS. 16A and 16B are cross-sectional views illustrating a method for fabricating a semiconductor device in accordance with another embodiment of the present invention. As for the remaining fabrication method other than the doping step 251 of the oxidation inhibition species 25, the above embodiments of the present invention will be referred to.

Referring to FIG. 16A, an initial gate dielectric layer 12 may be formed on a substrate 11. For example, the initial gate dielectric layer 12 may, for example, include silicon oxide.

A gate conductive layer 13 may be formed over the initial gate dielectric layer 12. The gate conductive layer 13 may be of a columnar structure and may, for example, include columnar crystal polysilicon grains and grain boundaries.

A mask layer 24 may be formed over the gate conductive layer 13. The mask layer 24 may expose a source side S2 and block a drain side S1.

A doping process 251 of the oxidation inhibition species 25 may be performed on a pre-patterned gate structure PPG including a stack of the initial gate dielectric layer 12 and the gate conductive layer 13. The oxidation inhibition species 25 may include nitrogen.

The selected portion of the initial gate dielectric layer 13 may be doped with an oxidation inhibition species 25. The un-selected portion of the initial gate dielectric layer 13 may not be doped with the oxidation inhibition species 25.

Referring to FIG. 16B, a re-growth process 16 may then be performed. The re-growth process 16 may include an oxidation process performed in an oxygen atmosphere. Through the re-growth process 16, the initial gate dielectric layer 13 locally doped with the oxidation inhibition species 25 may re-grow at a suppressed rate or may be fully suppressed. For example, the re-growth may be fully suppressed in the portion which is doped with the oxidation-inhibiting species 25, and a growth layer G3 may be formed only in a portion which is not doped with the oxidation inhibition species 25 as illustrated in FIG. 16B. The growth layer G3 may be thinner than a first growth layer G1 of FIG. 2C. This is because the growth layer G3 grows without an oxidation promotion species.

As described above, an asymmetric gate dielectric layer structure may be formed using the oxidation inhibition species 25.

Subsequently, a patterned gate structure may be formed by etching the pre-patterned gate structure PPG.

Figure 17A:
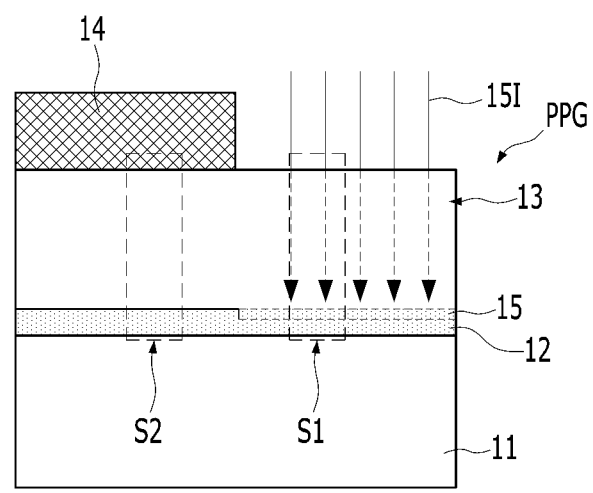
FIGS. 17A to 17C are cross-sectional views illustrating a method for fabricating a semiconductor device in accordance with an embodiment of the present invention.
Figure 17B:
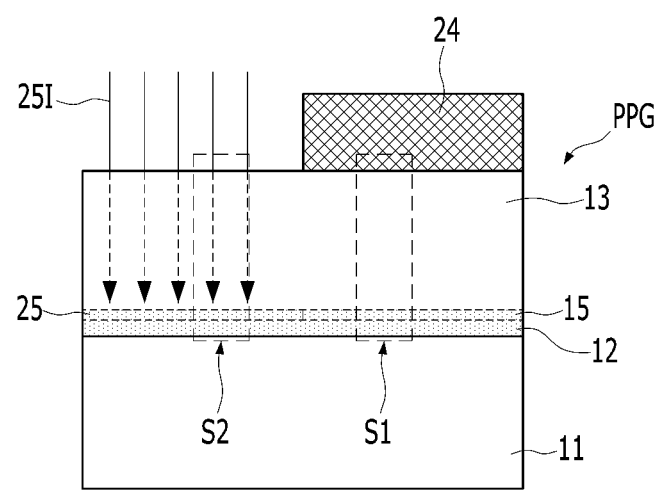
Figure 17C:
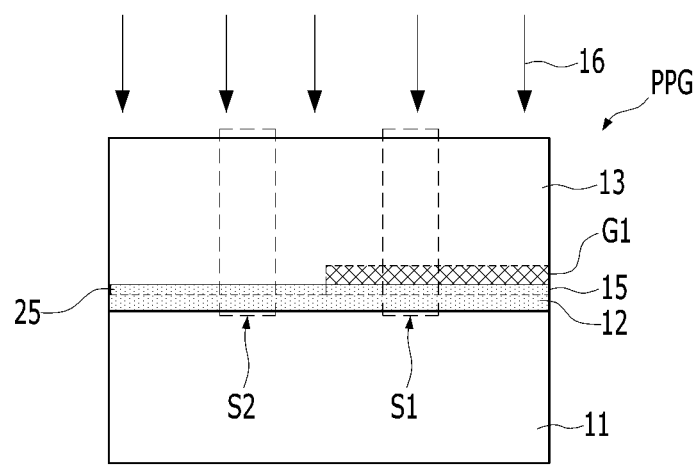

FIGS. 17A to 17C are cross-sectional views illustrating a method for fabricating a semiconductor device in accordance with another embodiment of the present invention. Hereinafter, a doping process 15I of an oxidation promotion species 15 and a doping process 25I of an oxidation inhibition species 25 may both be performed according to an embodiment of the present invention. The doping process 15I of the oxidation promotion species 15 will be described with reference to FIGS. 2A and 2B. The doping process 25I of the oxidation inhibition species 25 may be similar to the method described above with reference to FIGS. 16A and 16B.

Referring to FIGS. 17A and 2A, an initial gate dielectric layer 12 may be formed over the substrate 11. The initial gate dielectric layer 12 may, for example, include silicon oxide. A gate conductive layer 13 may be formed over the initial gate dielectric layer 12. The gate conductive layer 13 may include a columnar crystal grain structure such as, for example, a columnar crystal grain polysilicon structure. The stack of the initial gate dielectric layer 12 and the gate conductive layer 13 may be referred to as a pre-patterned gate structure PPG.

Referring to FIGS. 17A and 2B, a mask layer 14 may be formed over the gate conductive layer 13. The mask layer 14 may block the source side S2 and expose the drain side S1.

The doping process 15I of the oxidation promotion species 15 may be performed. In an embodiment, the oxidation promotion species 15 may contain fluorine (F).

Referring to FIGS. 17B and 16A, a mask layer 24 may be formed over the gate conductive layer 13, after the mask layer 14 is removed. The mask layer 24 may expose the source side S2 and block the drain side S1.

The doping process 25I of the oxidation inhibition species 25 may be performed. The oxidation inhibition species 25 may include nitrogen.

As described above, the initial gate dielectric layer 13 may be doped with both of the oxidation promotion species 15 and the oxidation inhibition species 25. The initial gate dielectric layer 13 of the drain side S1 may be doped with the oxidation promotion species 15, and the initial gate dielectric layer 13 of the source side S2 may be doped with the oxidation inhibition species 25.

Referring to FIG. 17C, a re-growth process 16 may then be performed. The re-growth process 16 may include an oxidation process in an oxygen atmosphere. The initial gate dielectric layer 13 may re-grow through the re-growth process 16. The re-growth may be suppressed in a portion of the initial gate dielectric layer 12 that is doped with the oxidation inhibition species 25. The portion of the initial gate dielectric layer 12 that is doped with the oxidation promotion species 15 may quickly re-grow. The second growth layer G2 of FIG. 2B may not grow on the source side S2 due to the oxidation inhibition species 25. On the drain side S1, the growth layer G1 may be formed as the initial gate dielectric layer 12 quickly re-grows due to the oxidation promotion species 15.

Subsequently, a patterned gate structure may be formed by etching the pre-patterned gate structure PPG.

Figure 18:
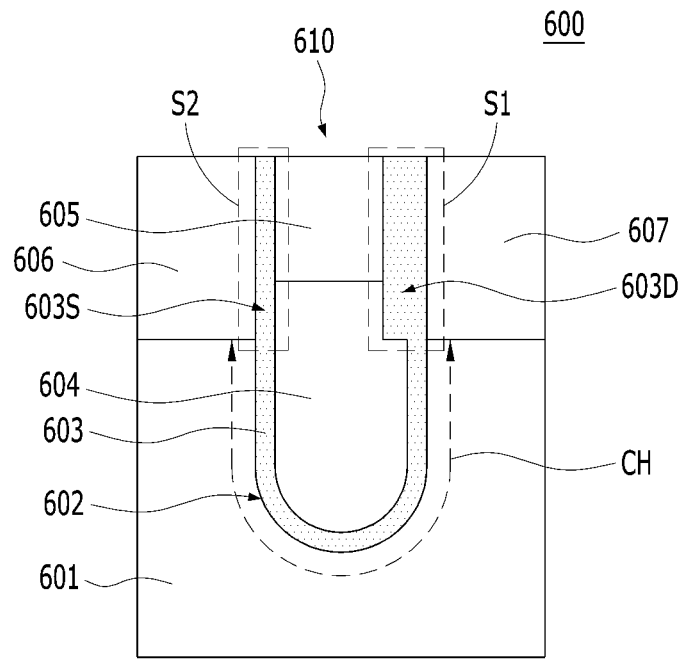
FIG. 18 is a cross-sectional view illustrating a semiconductor device in accordance with an embodiment of the present invention.

FIG. 18 is a cross-sectional view illustrating a semiconductor device 600 in accordance with another embodiment of the present invention.

Referring to FIG. 18, the semiconductor device 600 may be a transistor having a buried gate structure.

The semiconductor device 600 may include a gate structure 610 formed in a substrate 601. The substrate 601 may include a gate trench 602, and the gate structure 610 may be disposed inside the gate trench 602. The gate structure 610 may be referred to as a buried gate structure. For example, the buried gate structure may be a buried word line. The gate structure 610 may include a drain side S1 and a source side S2. The gate structure 610 may include a gate dielectric layer 603, a gate electrode 604, and a gate capping layer 605. The substrate 601 may further include a source region 606 and a drain region 607. The source region 606 and the drain region 607 may be isolated from each other with the gate trench 602 between them. A recess channel CH may be defined in the substrate 601 between the source region 606 and the drain region 607.

The gate dielectric layer 603 may have an asymmetric structure having a non-uniform thickness. The gate dielectric layer 603 may include a drain-side gate dielectric layer 603D and a source-side gate dielectric layer 603S. The drain-side gate dielectric layer 603D may be thicker than the source-side gate dielectric layer 603S. The drain-side gate dielectric layer 603D may include an oxidation promotion species (not shown), and the source-side gate dielectric layer 603S may not include an oxidation promotion species. The drain-side gate dielectric layer 603D may overlap with the drain region 607 horizontally. In other words, the drain-side gate dielectric layer 603D may be aligned in the horizontal direction with the drain region 607.

Figure 19:
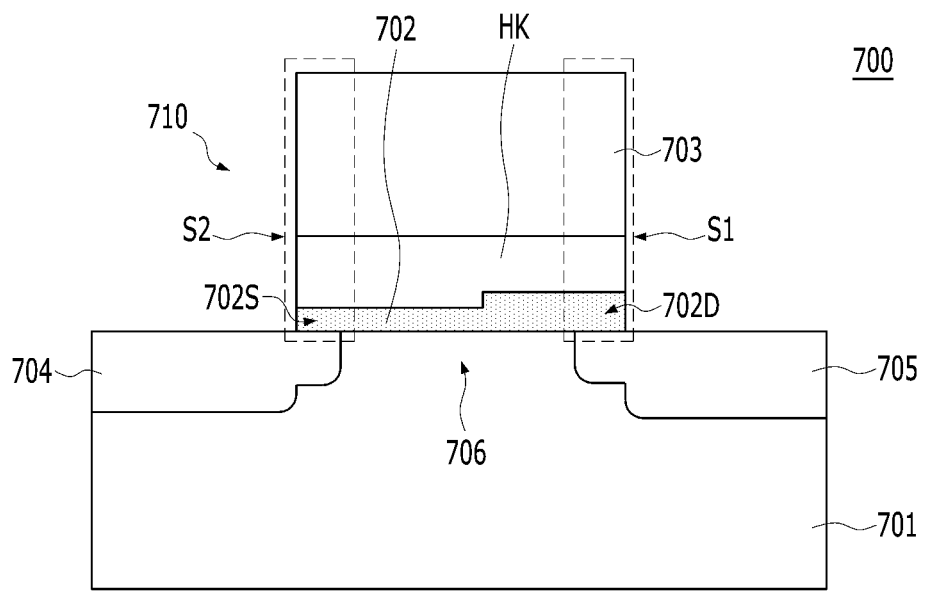
FIG. 19 is a cross-sectional view illustrating a semiconductor device in accordance with an embodiment of the present invention.

FIG. 19 is a cross-sectional view illustrating a semiconductor device 700 in accordance with another embodiment of the present invention.

Referring to FIG. 19, the semiconductor device 700 may include a gate structure 710 over a substrate 701, and the gate structure 710 may include a stack of an interface layer 702, a high-k layer HK, and a metal gate electrode 703. The stack of the interface layer 702 and the high-k layer HK may be referred to as a gate dielectric layer. The gate structure 710 may be referred to as HKMG (High-k Metal Gate). The interface layer 702 may, for example, include silicon oxide and may contain an oxidation promotion species (not shown). The gate structure 710 may include a drain side S1 and a source side S2. The interface layer 702 may include a drain side interface layer 702D and a source side interface layer 702S. The drain-side interface layer 702D may be thicker than the source-side interface side 702S. The interface layer 702 may be thick on the drain side S1 of the gate structure 710. The interface layer 702 may have an asymmetric structure having a non-uniform thickness.

Figure 20:
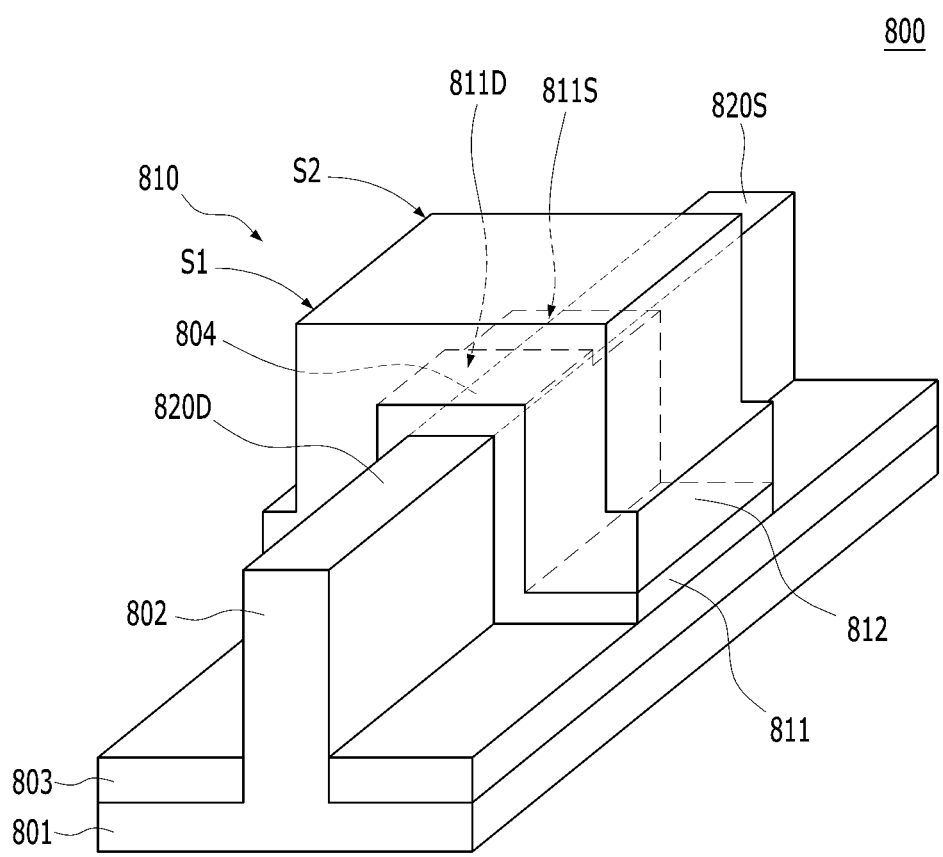
FIG. 20 is a cross-sectional view illustrating a semiconductor device in accordance with an embodiment of the present invention.

FIG. 20 is a cross-sectional view illustrating a semiconductor device 800 in accordance with another embodiment of the present invention.

Referring to FIG. 20, the semiconductor device 800 may include a fin field effect transistor (FinFET). The semiconductor device 800 may include a substrate 801, a fin structure 802 extending from the substrate 801, an isolation layer 803 surrounding a lower portion of the fin structure 802, and a gate structure 810 formed over the fin structure 802. The gate structure 810 may include a gate dielectric layer 811 and a gate electrode 812. The fin structure 802 may include a fin channel 804, a source region 820S, and a drain region 820D. The gate electrode 812 may be formed by a gate last process or a gate replacement process.

The gate structure 810 may include a drain side S1 and a source side S2. The gate dielectric layer 811 may include a drain-side gate dielectric layer 811D and a source-side gate dielectric layer 811S. The drain-side gate dielectric layer 811D may be thicker than the source-side gate dielectric layer 811S. The drain-side gate dielectric layer 811D may include an oxidation promotion species (not shown). A thick drain-side gate dielectric layer 811D may be formed on the drain side S1 of the gate structure 810. The gate dielectric layer 811 may be of an asymmetric structure having a non-uniform thickness.

According to the embodiments of the present invention, vertical and lateral electric fields may be reduced at an edge of a drain region by forming an asymmetric gate dielectric layer with a non-uniform thickness. As a result, hot carrier may be improved by reducing the vertical and lateral electric fields.

Also, gate-induced drain leakage (GIDL) stress and off-state stress may be reduced by increasing the thickness of the gate dielectric layer in a portion where a gate electrode and a drain region overlap with each other.

In addition, negative bias temperature instability (NBTI) may be improved as the silicon and fluorine bonds are increased by doping a gate electrode of a P-channel Field Effect Transistor (PFET) with fluorine as an oxidation promotion species.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a gate structure including a dielectric material over a substrate and a columnar crystal grain material over the dielectric material, the gate structure including a source side and a drain side;
    an oxidation promotion species doped on the drain side of the gate structure to increase a thickness of the dielectric material on the drain side of the gate structure; and
    a source region and a drain region formed in the substrate, wherein the source region and the drain region are formed to laterally extend to overlap with the source side and the drain side of the gate structure, respectively,
    wherein the dielectric material of the gate structure has a thickness that gradually and continuously increases from the source side of the gate structure toward the drain side of the gate structure.

2. The semiconductor device of claim 1, wherein the oxidation promotion species includes fluorine (F).

3. The semiconductor device of claim 1, wherein the dielectric material includes silicon oxide, and the oxidation promotion species increases a thickness of silicon oxide on the drain side of the gate structure.

4. The semiconductor device of claim 1, wherein the dielectric material includes a stack of silicon oxide and a high-k material, and the oxidation promotion species increases a thickness of silicon oxide on the drain side of the gate structure.

5. The semiconductor device of claim 1, wherein the columnar crystal grain material includes polysilicon.

6. The semiconductor device of claim 1,
    wherein, when the gate structure includes an NMOSFET gate structure the oxidation promotion species is included in doped on the drain side of the NMOSFET gate structure, and
    wherein, when the gate structure includes a PMOSFET gate structure, the oxidation promotion species is doped on the drain side and the source side of the PMOSFET gate structure.

7. The semiconductor device of claim 1, wherein the substrate includes
    a channel region that is disposed between the source region and the drain region and overlaps with the gate structure, and
    the channel region includes at least one selected from a group including a planar channel, a recess channel, a fin channel, and combinations thereof.

8. The semiconductor device of claim 7, wherein the channel region includes
    a doped channel that is doped with a P-type impurity that contacts the source side of the gate structure, and
    the doped channel does not overlap with the drain side of the gate structure.

9. The semiconductor device of claim 1, wherein the dielectric material of the gate structure includes:
    a drain side dielectric material formed on the drain side of the gate structure; and
    a source side dielectric material formed on the source side of the gate structure,
    wherein the drain side dielectric material contains the oxidation promotion species, and the drain side dielectric material is thicker than the source side dielectric material.

10. The semiconductor device of claim 1, wherein the gate structure includes:
    a columnar crystal grain portion including the columnar crystal grain material and formed on the drain side of the gate structure; and
    a non-columnar crystal grain portion formed on the source side of the gate structure,
    wherein the columnar crystal grain portion contains the oxidation promotion species, and the non-columnar crystal grain portion contains the oxidation promotion species.

* * * * *